(12) United States Patent
Kim et al.

(10) Patent No.: US 10,283,685 B2
(45) Date of Patent: May 7, 2019

(54) LIGHT EMITTING DEVICE AND METHOD OF FABRICATING THE SAME

(71) Applicant: SEOUL VIOSYS CO., LTD., Gyeonggi-do (KR)

(72) Inventors: Chang Yeon Kim, Ansan-si (KR); Ju Yong Park, Ansan-si (KR); Sung Su Son, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 42 days.

(21) Appl. No.: 15/514,492

(22) PCT Filed: Sep. 14, 2015

(86) PCT No.: PCT/KR2015/009614
§ 371 (c)(1),
(2) Date: Mar. 24, 2017

(87) PCT Pub. No.: WO2016/047950
PCT Pub. Date: Mar. 31, 2016

(65) Prior Publication Data
US 2017/0279020 A1    Sep. 28, 2017

(30) Foreign Application Priority Data

Sep. 26, 2014 (KR) .................. 10-2014-0129019
Oct. 21, 2014 (KR) .................. 10-2014-0142580

(51) Int. Cl.
*H01L 33/62* (2010.01)
*H01L 23/00* (2006.01)
(Continued)

(52) U.S. Cl.
CPC .............. *H01L 33/62* (2013.01); *H01L 24/11* (2013.01); *H01L 24/13* (2013.01); *H01L 33/007* (2013.01);
(Continued)

(58) Field of Classification Search
CPC ............................ H01L 33/387; H01L 33/62
See application file for complete search history.

(56) References Cited

U.S. PATENT DOCUMENTS

2009/0107584 A1   4/2009   Sengupta et al.
2010/0148198 A1   6/2010   Sugizaki et al.
(Continued)

FOREIGN PATENT DOCUMENTS

JP    2012059921 A    3/2012
JP    2014053593 A    3/2014
(Continued)

OTHER PUBLICATIONS

Kuramoto, M. "Die Bonding for a Nitride Light-Emitting Diode by Low-Temperature Sintering of Micrometer Size Silver Particles" IEEE Trans. on Comp. and Pack. Tech. vol. 33, No. 4, Dec. 2010 pp. 801-808).*

(Continued)

*Primary Examiner* — Asok K Sarkar
*Assistant Examiner* — Grant S Withers
(74) *Attorney, Agent, or Firm* — Perkins Coie LLP

(57) ABSTRACT

Provided are a light emitting device and a method of fabricating the same. The light emitting device includes: a light emitting structure including a first conductivity type semiconductor layer, a second conductivity type semiconductor layer, and an active layer and including a first surface and a second surface; first and second contact electrodes each ohmic-contacting the first and second conductivity type semiconductor layers; and first and second electrodes disposed on the first surface of the light emitting structure, in which the first and second electrodes each include sintered metal particles and the first and second electrodes each (Continued)

include inclined sides of which the tangential gradients with respect to sides of vertical cross sections thereof are changing.

38 Claims, 21 Drawing Sheets

(51) Int. Cl.
| H01L 33/00 | (2010.01) |
| H01L 33/06 | (2010.01) |
| H01L 33/32 | (2010.01) |
| H01L 33/38 | (2010.01) |
| H01L 33/46 | (2010.01) |
| H01L 33/50 | (2010.01) |
| H01L 33/64 | (2010.01) |
| H01L 33/48 | (2010.01) |

(52) U.S. Cl.
CPC .......... *H01L 33/0079* (2013.01); *H01L 33/06* (2013.01); *H01L 33/32* (2013.01); *H01L 33/38* (2013.01); *H01L 33/46* (2013.01); *H01L 33/502* (2013.01); *H01L 33/647* (2013.01); *H01L 33/382* (2013.01); *H01L 33/486* (2013.01); *H01L 2224/1132* (2013.01); *H01L 2224/11318* (2013.01); *H01L 2224/11505* (2013.01); *H01L 2224/1329* (2013.01); *H01L 2224/13239* (2013.01); *H01L 2224/13244* (2013.01); *H01L 2224/13247* (2013.01); *H01L 2224/13269* (2013.01); *H01L 2924/12041* (2013.01); *H01L 2933/0016* (2013.01); *H01L 2933/0025* (2013.01); *H01L 2933/0041* (2013.01); *H01L 2933/0066* (2013.01); *H01L 2933/0075* (2013.01); *H01L 2933/0091* (2013.01)

(56) References Cited

U.S. PATENT DOCUMENTS

| 2011/0114978 A1 | 5/2011 | Kojima et al. | |
| 2011/0147774 A1 | 6/2011 | Wang et al. | |
| 2011/0294242 A1* | 12/2011 | Lu | H01L 33/20 438/27 |
| 2014/0217450 A1* | 8/2014 | Ishigami | H01B 1/22 257/98 |
| 2015/0034989 A1* | 2/2015 | Namiki | H01L 33/46 257/98 |
| 2015/0197672 A1* | 7/2015 | Namiki | H01L 24/29 257/99 |
| 2015/0280070 A1* | 10/2015 | Lee | H01L 33/60 257/98 |
| 2015/0372208 A1* | 12/2015 | Chae | H01L 33/62 257/98 |
| 2016/0365486 A1* | 12/2016 | Kim | H01L 33/382 |
| 2017/0170365 A1* | 6/2017 | Lim | H01L 33/44 |
| 2018/0190871 A1* | 7/2018 | Kim | H01L 33/36 |

FOREIGN PATENT DOCUMENTS

| KR | 1020100080423 A | 7/2010 |
| KR | 1020140073160 A | 6/2014 |

OTHER PUBLICATIONS

Certified copy of KR application 10-2014-0129019 dated Sep. 26, 2014.*
International Search Report and Written Opinion for PCT/KR2015/009614, filed Sep. 14, 2015, Applicant: Seoul Viosys Co., Ltd., dated Jan. 6, 2016, ISA/KR, 8 pages.
Mokhtari, et al. "Disabling of Nanoparticle Effects at Increased Temperature in Nanocomposite Solders" Journal of Electronic Materials, (2012), vol. 41, No. 7, pp. 1907-1914.
Mavoori et al. "New, Creep-Resistant, Low Melting Point Solders with Ultrafine Oxide Dispersions" Journal of Electronic Materials (1998), vol. 27, No. 11, pp. 1216-1222.
First Office Action dated Aug. 28, 2018 in Chinese Patent Application No. 201580051056.2, 11 pages, English translation.
Research advances in nano-composite solders, J. Shen and Y. C. Chan, Microelectronics Reliability, vol. 49 Edition 3, Mar. 31, 2009, pp. 223-234.

* cited by examiner

[Fig. 1]
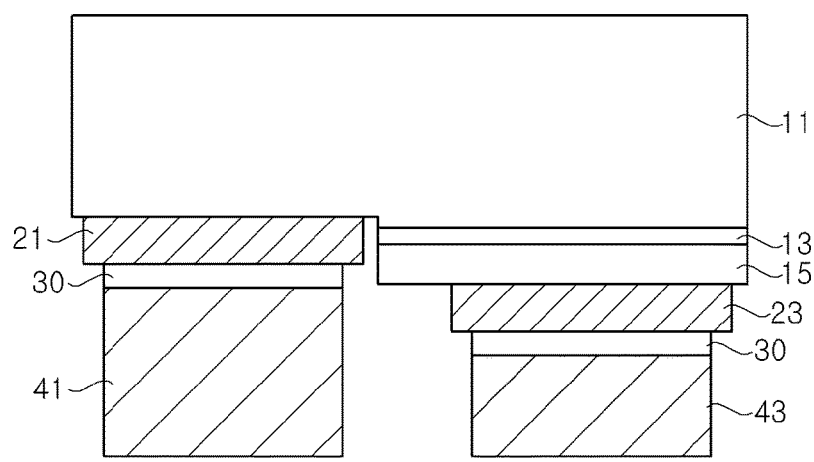

[Fig. 2]
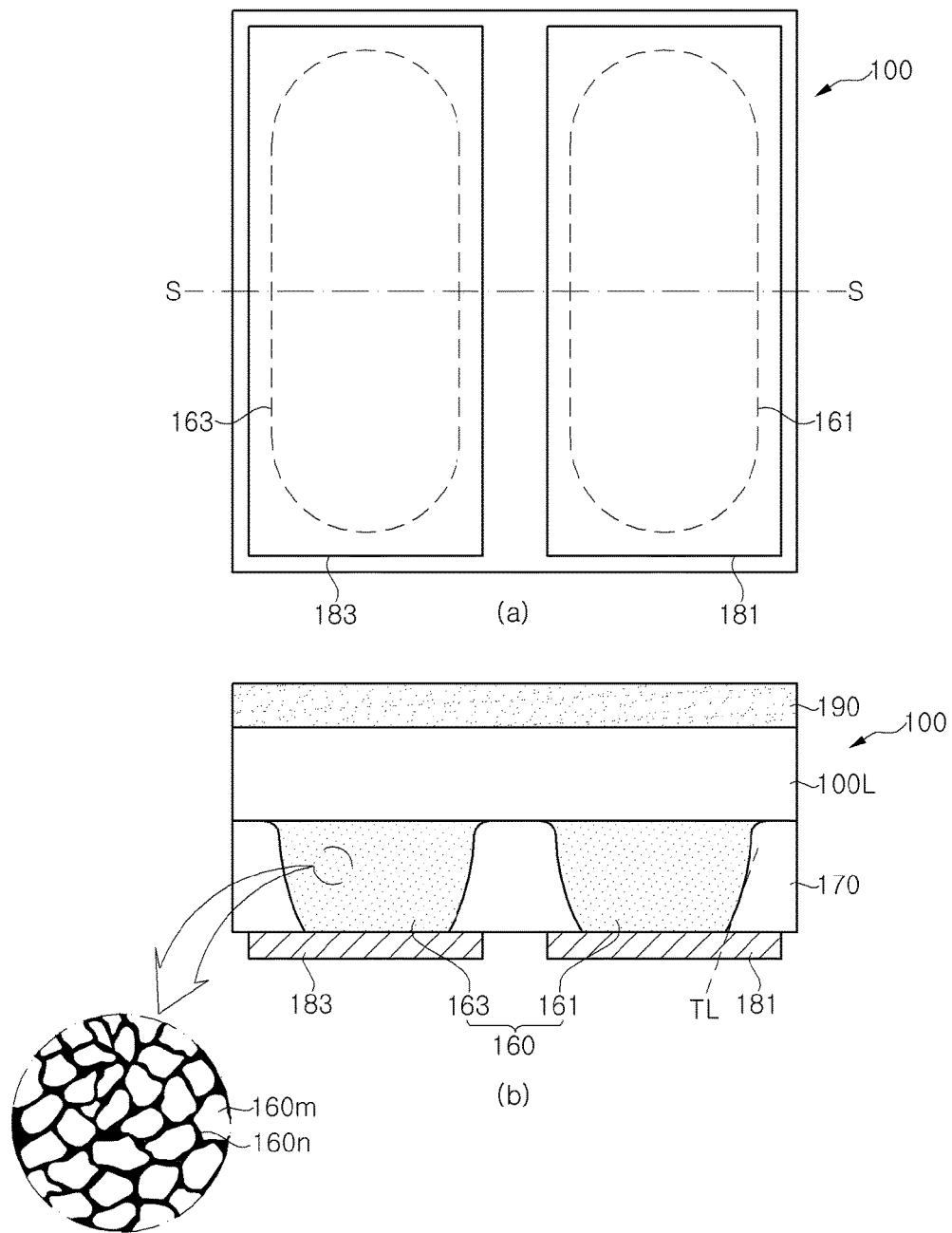

[Fig. 3]
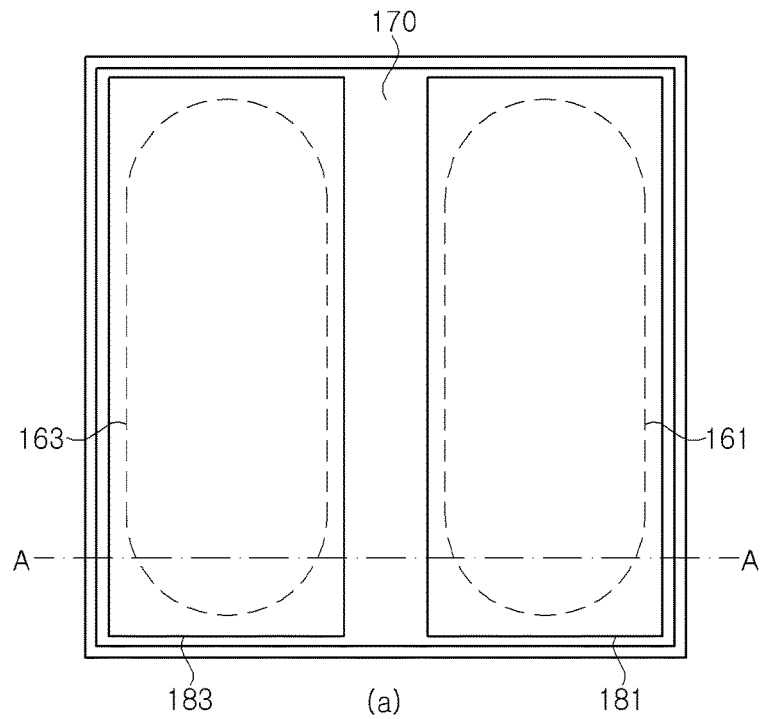
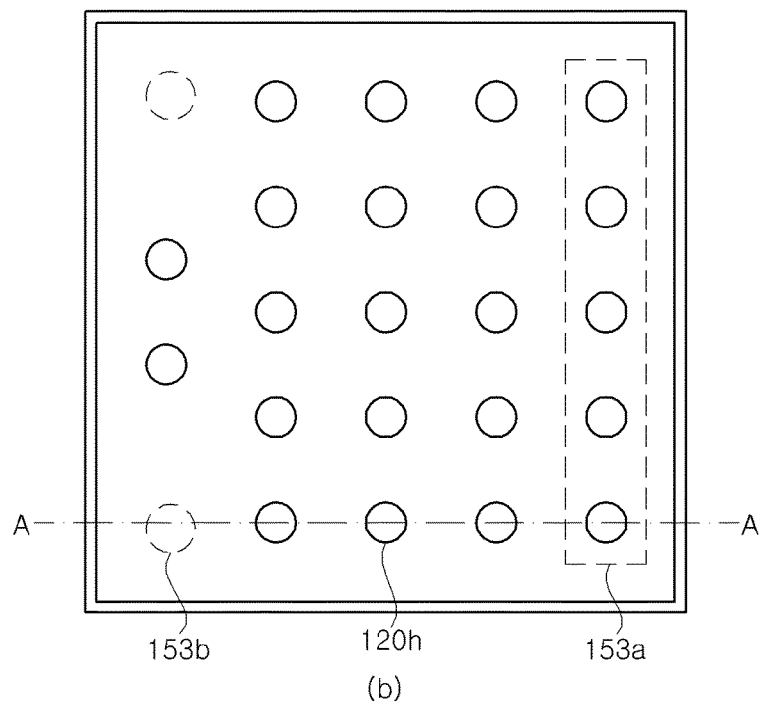

[Fig. 4]
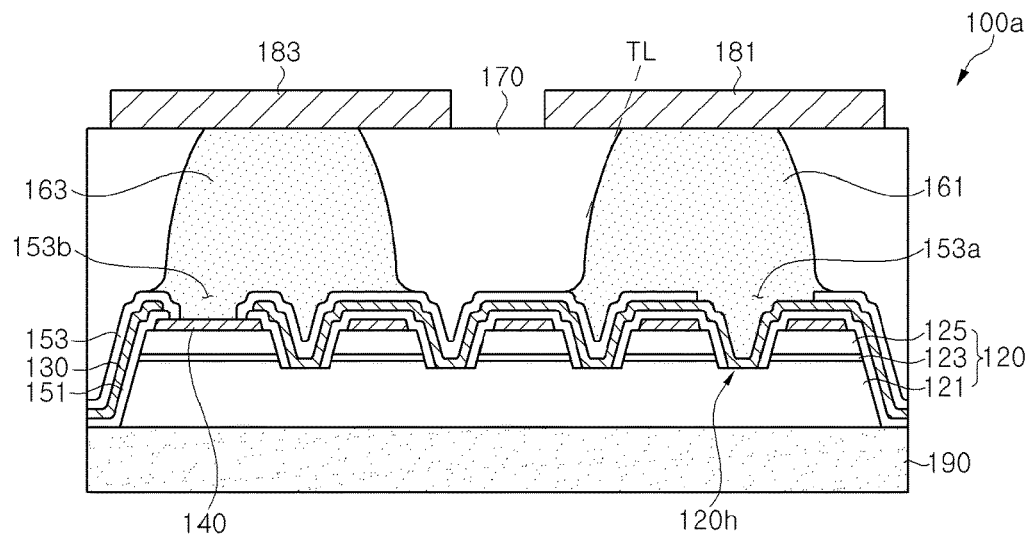
[Fig. 5]
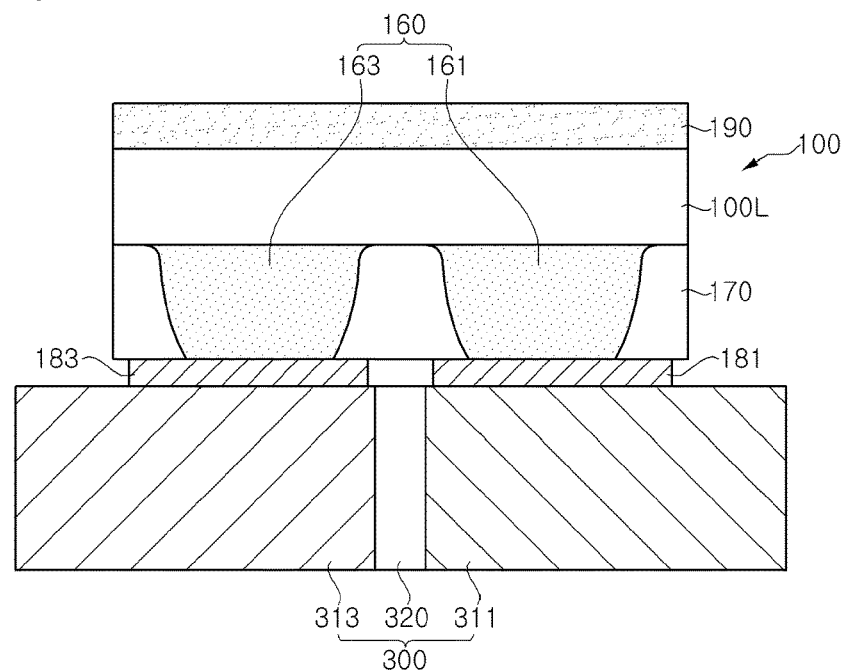
[Fig. 6]
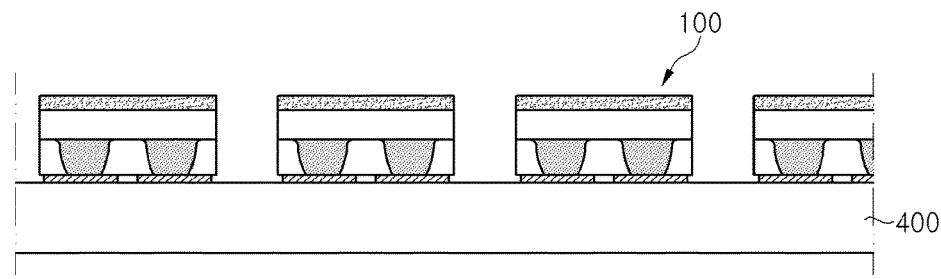

[Fig. 7]
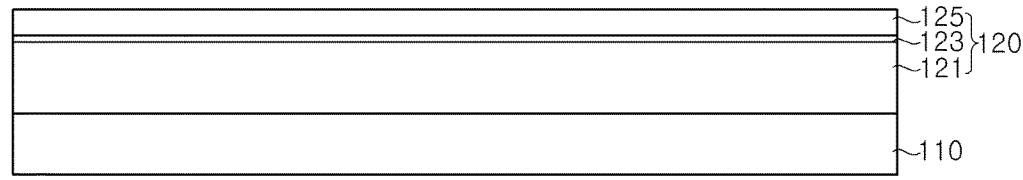
[Fig. 8]
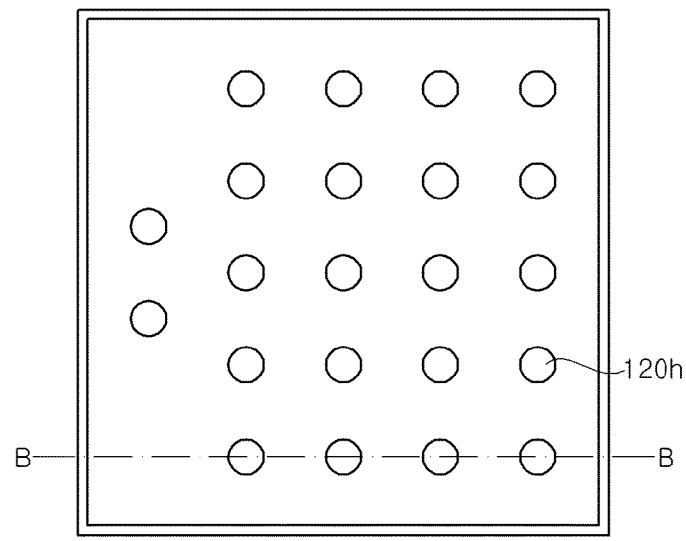
(a)
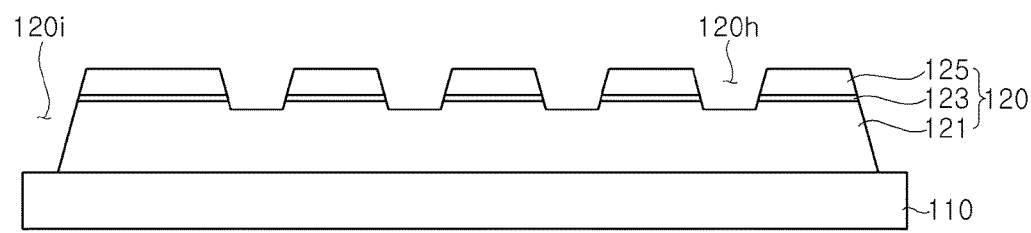
(b)
[Fig. 9]
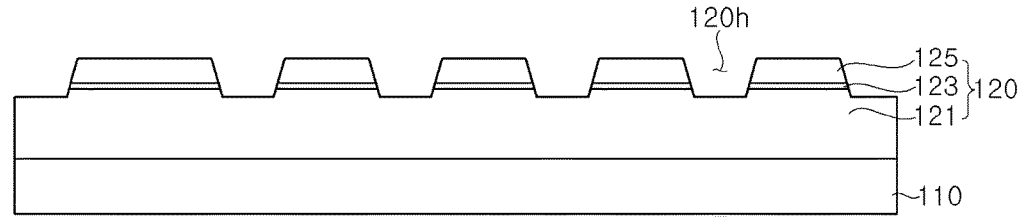

[Fig. 10]
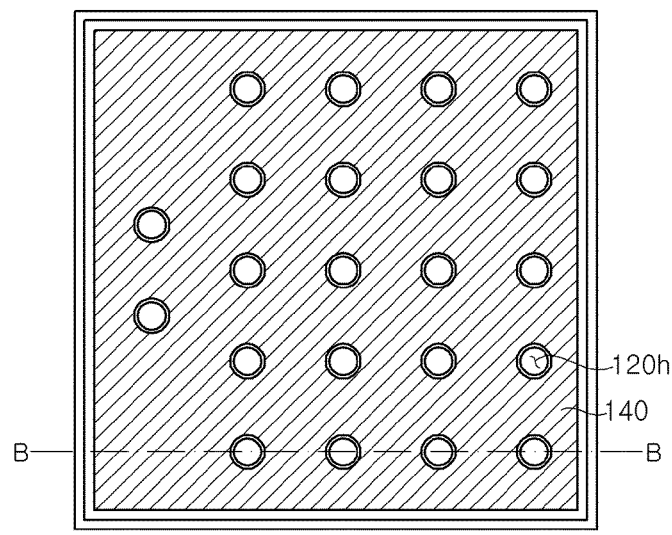
(a)
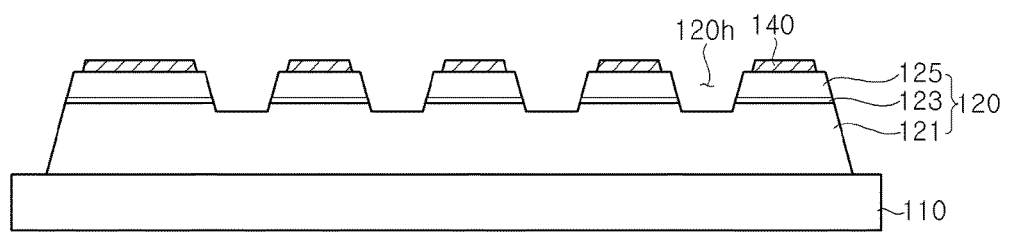
(b)

[Fig. 11]
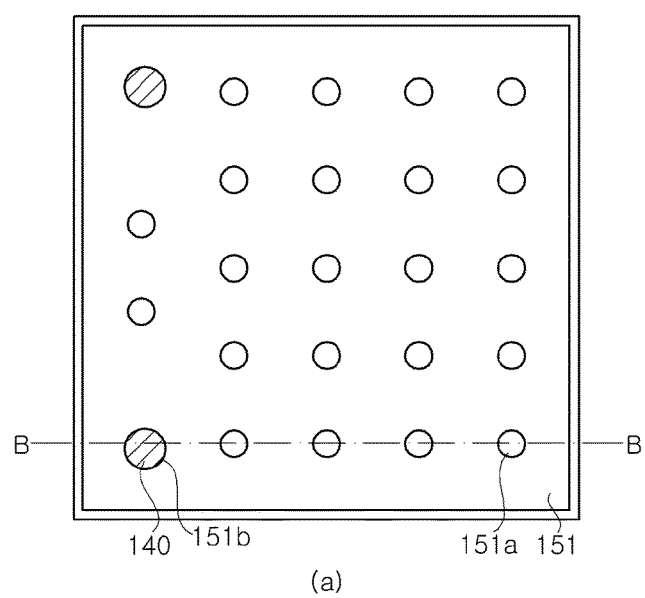
(a)
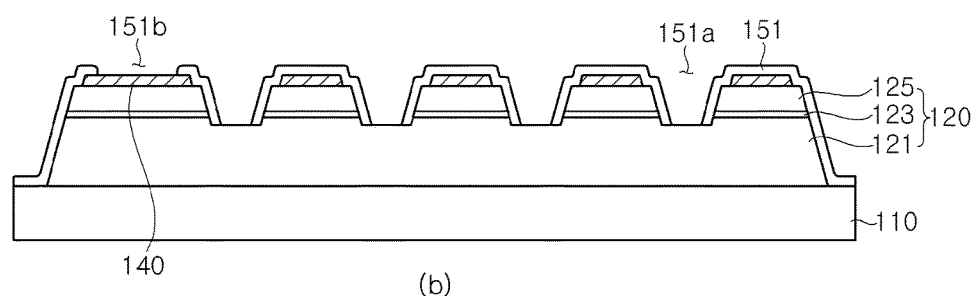
(b)

[Fig. 12]
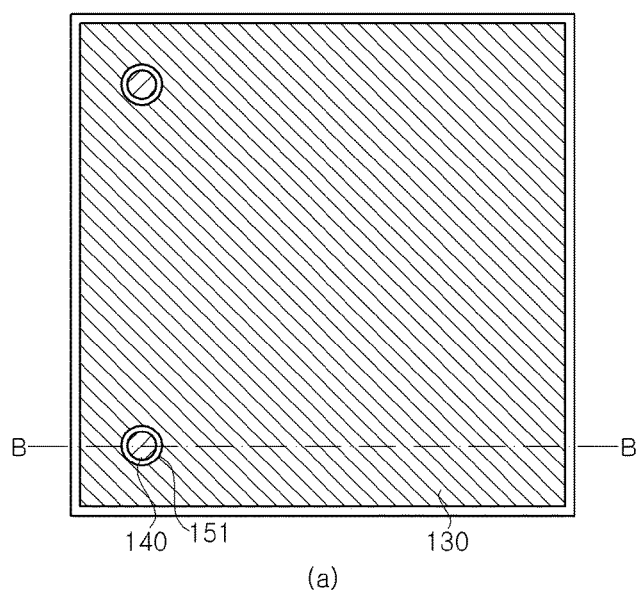
(a)
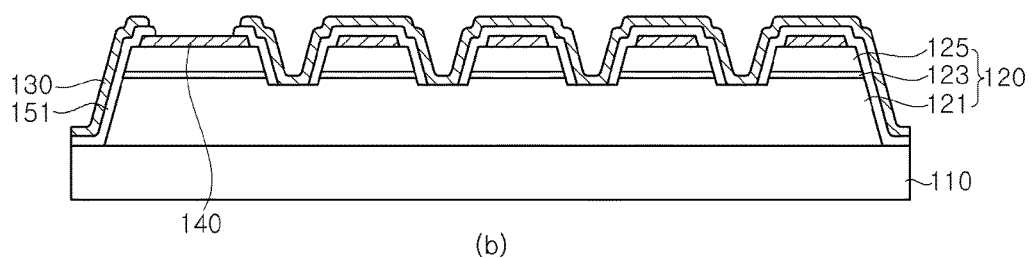
(b)

[Fig. 13]
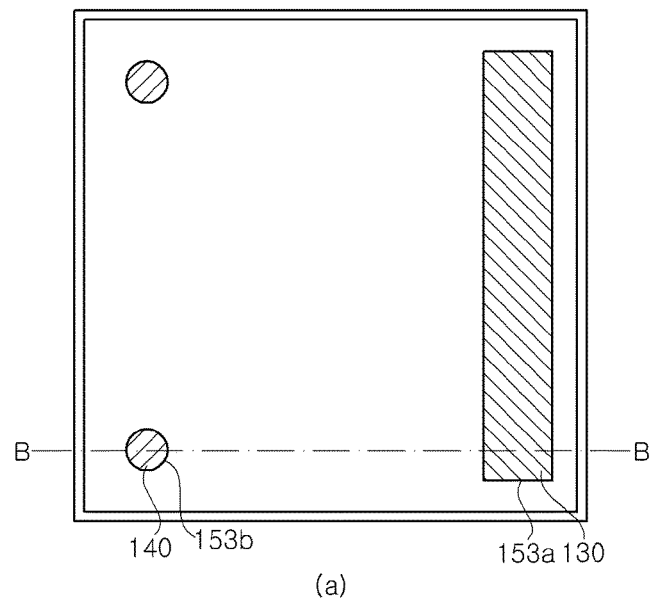
(a)
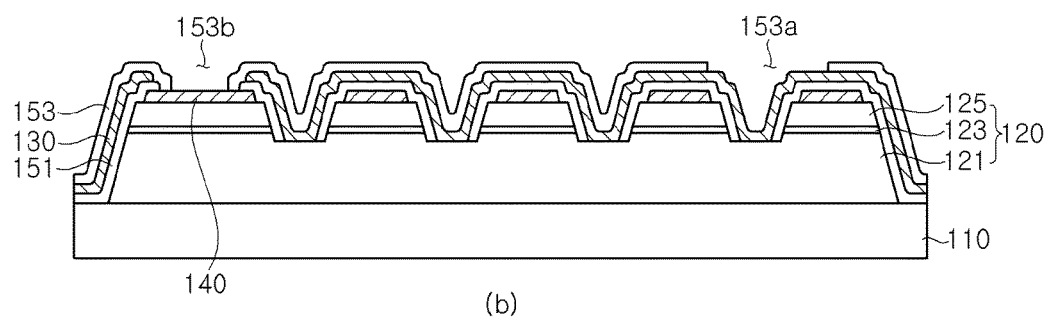
(b)
[Fig. 14a]
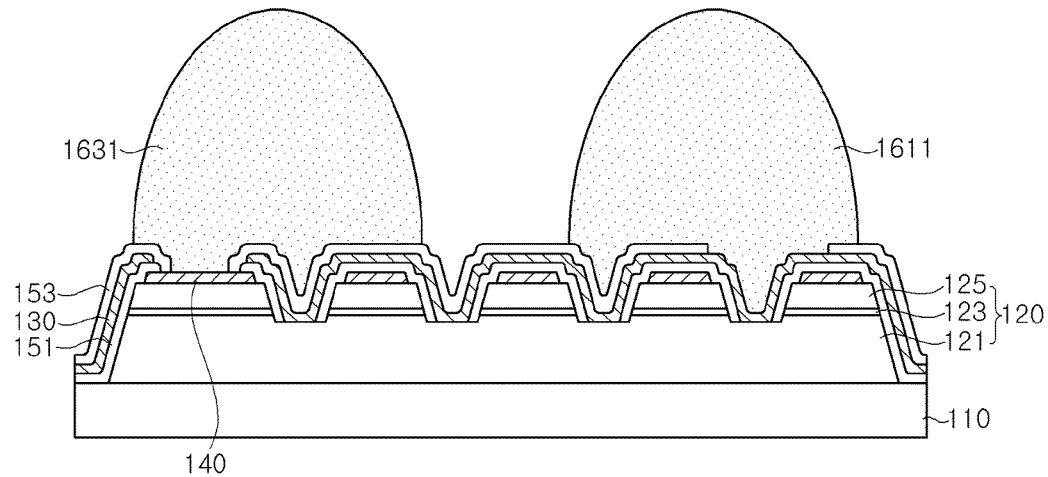

[Fig. 14b]
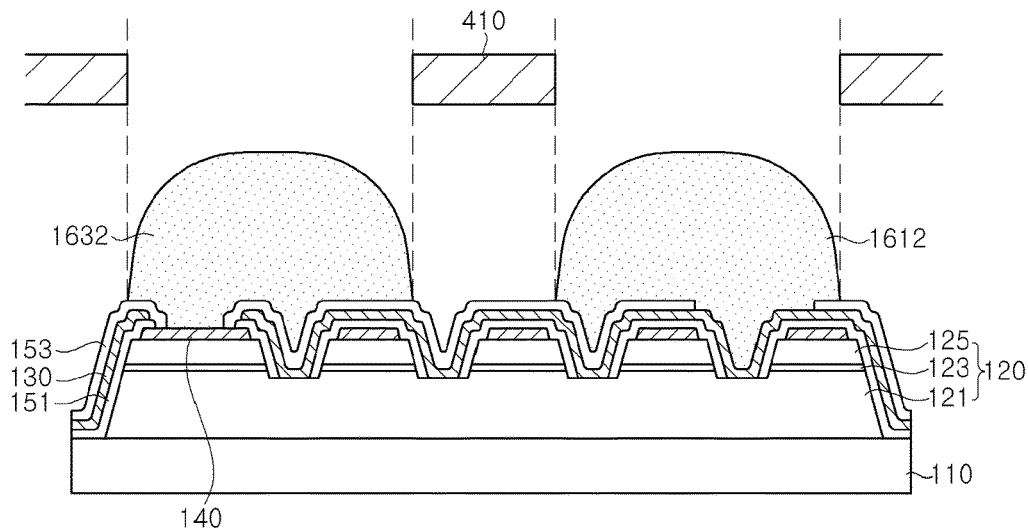
[Fig. 15]
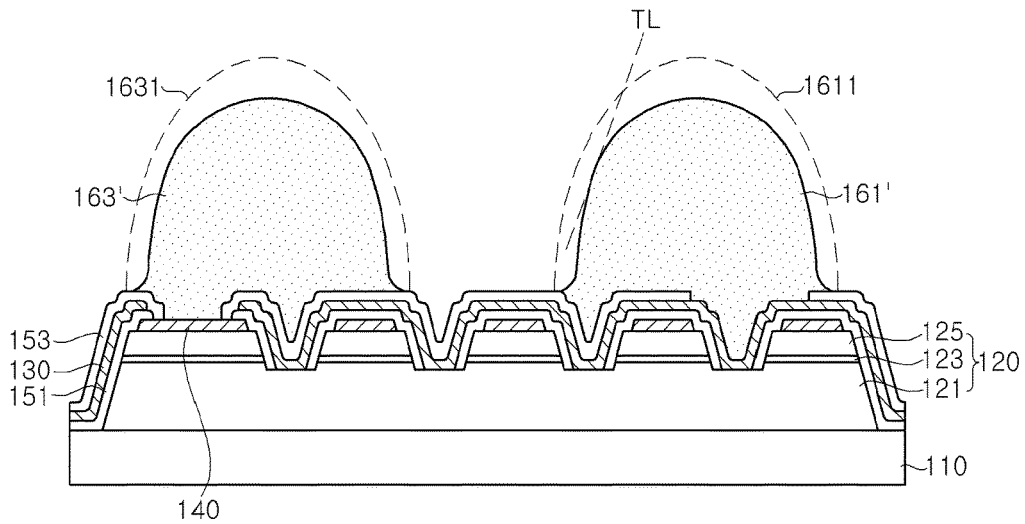
[Fig. 16]
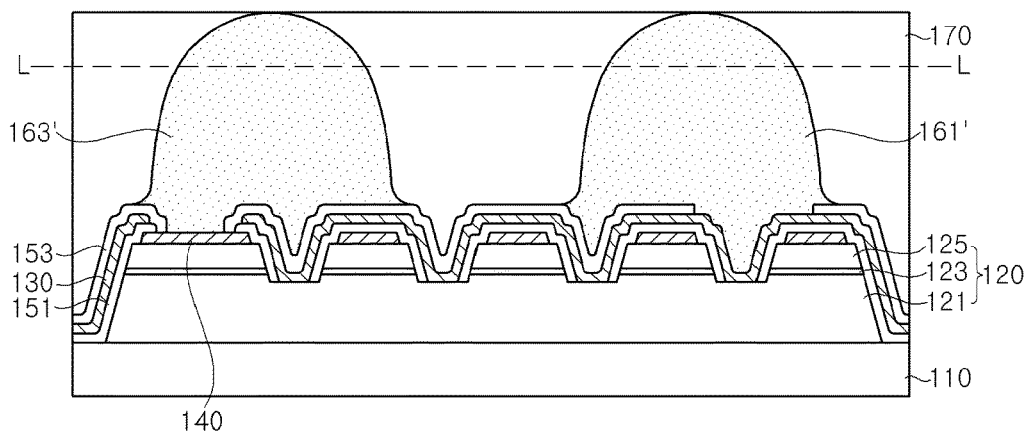

[Fig. 17]
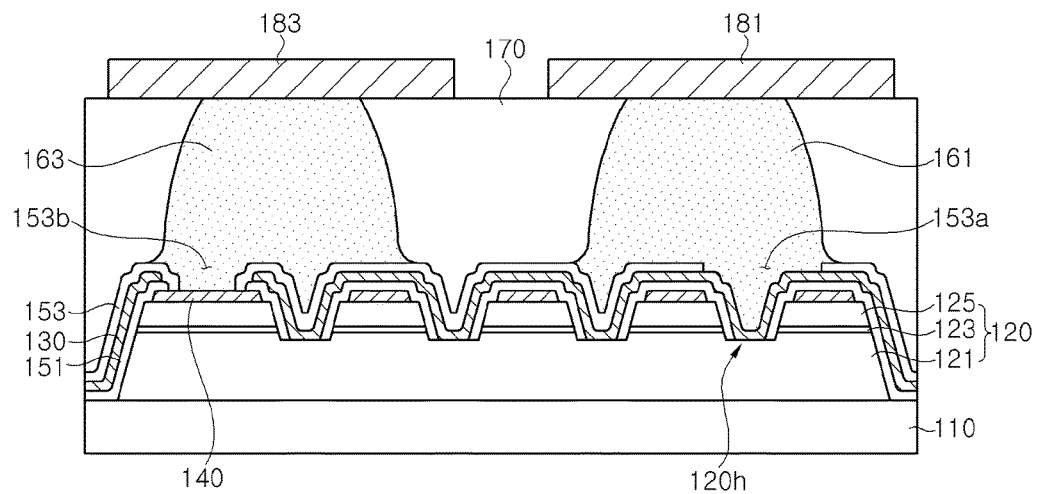
[Fig. 18]
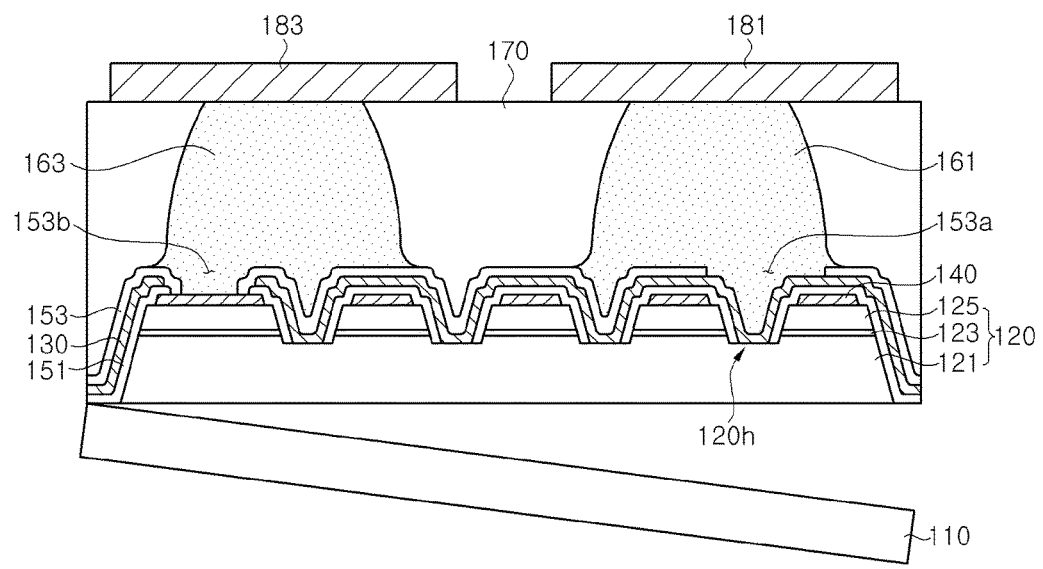

[Fig. 19]
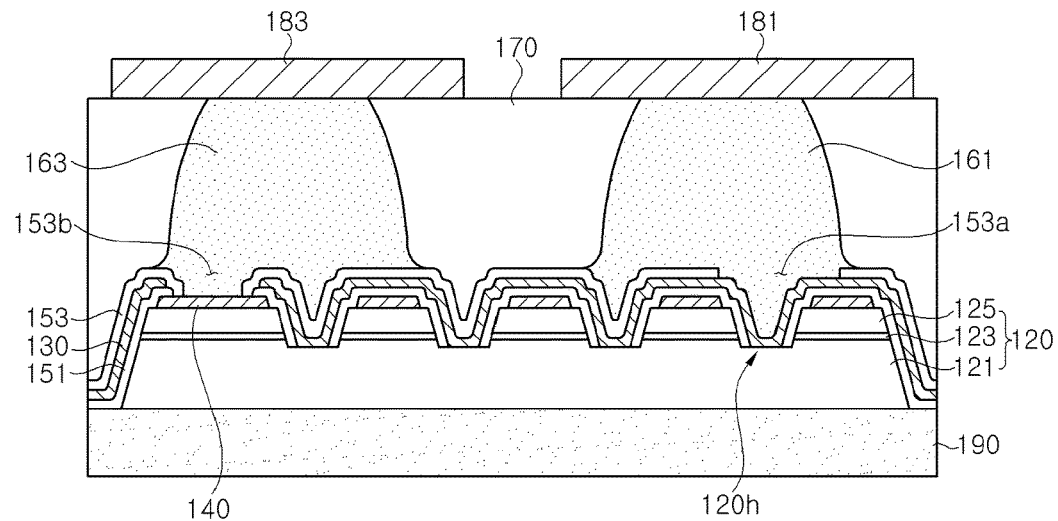
[Fig. 20]
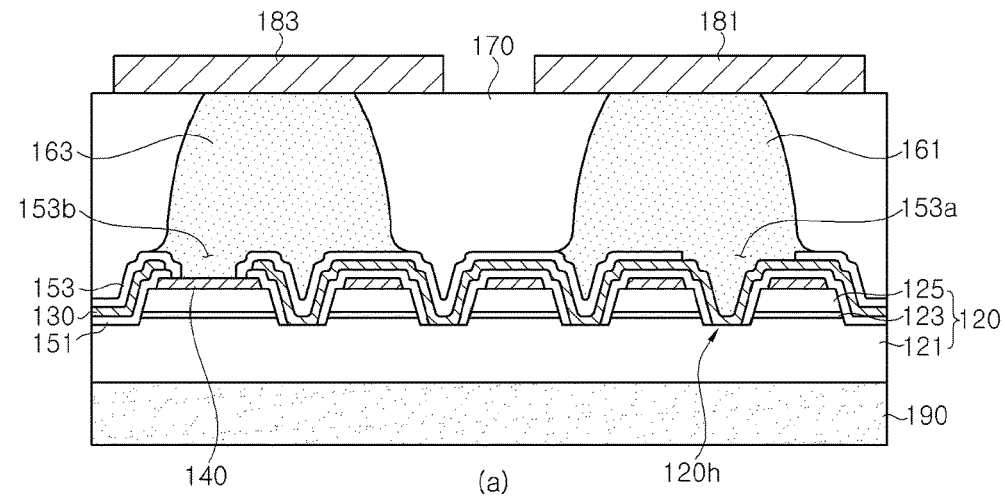
(a)
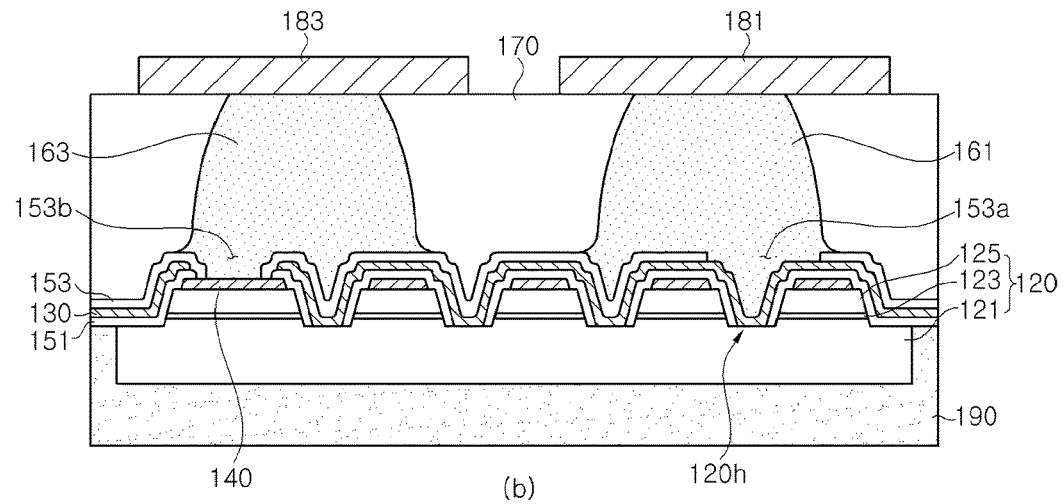
(b)

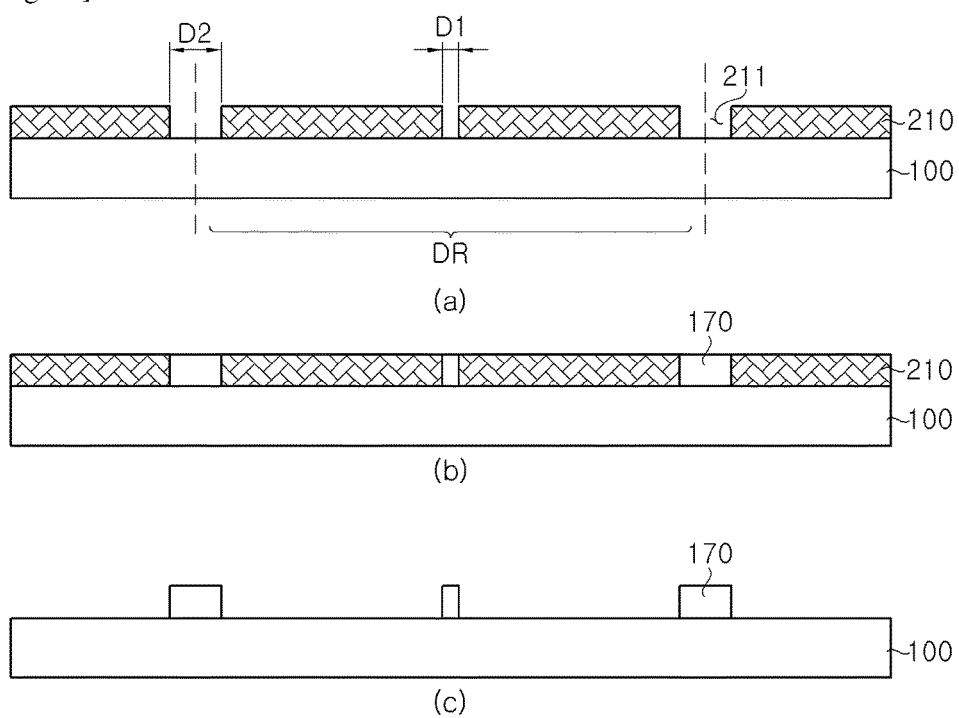
[Fig. 21]

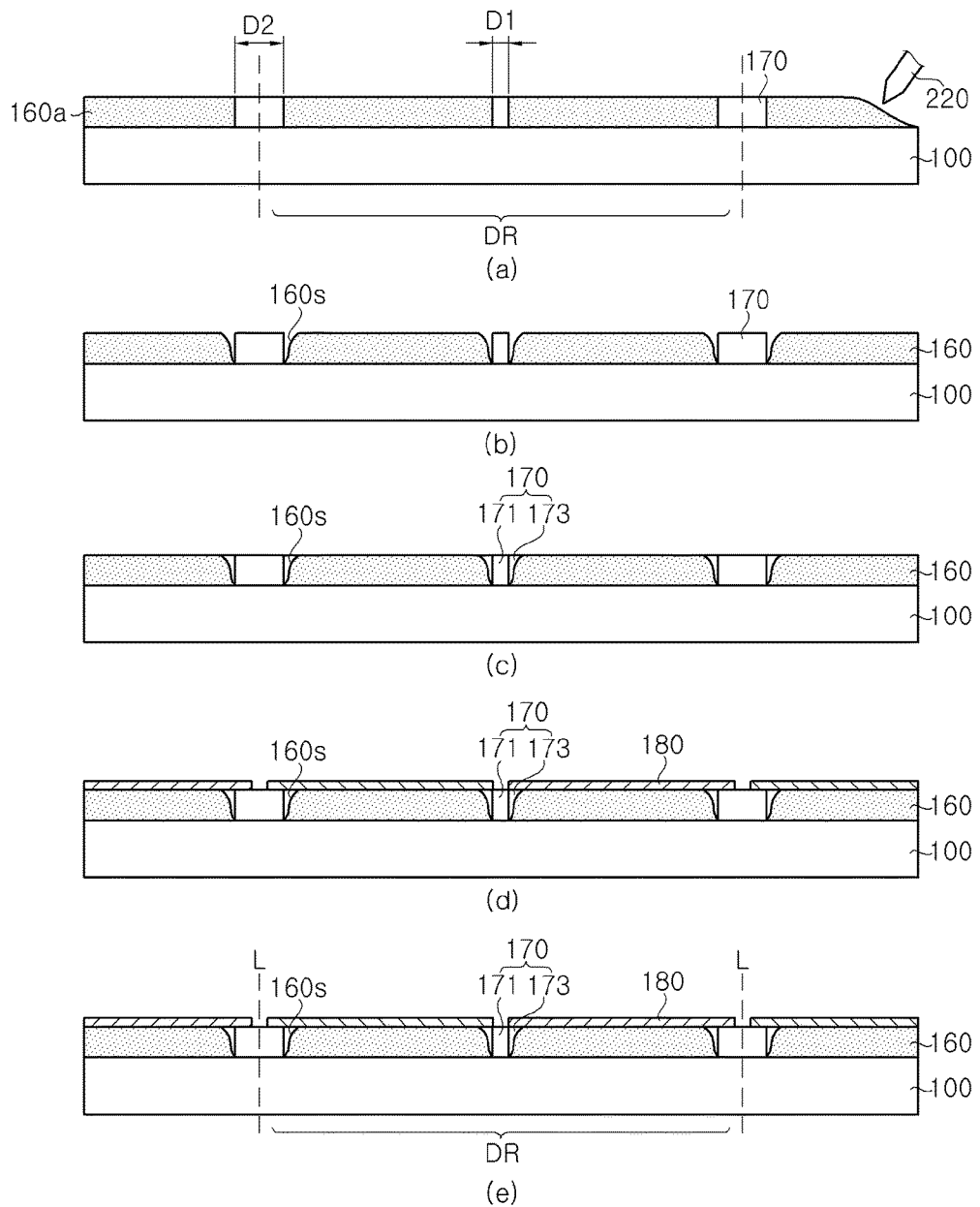
[Fig. 22]

[Fig. 23]
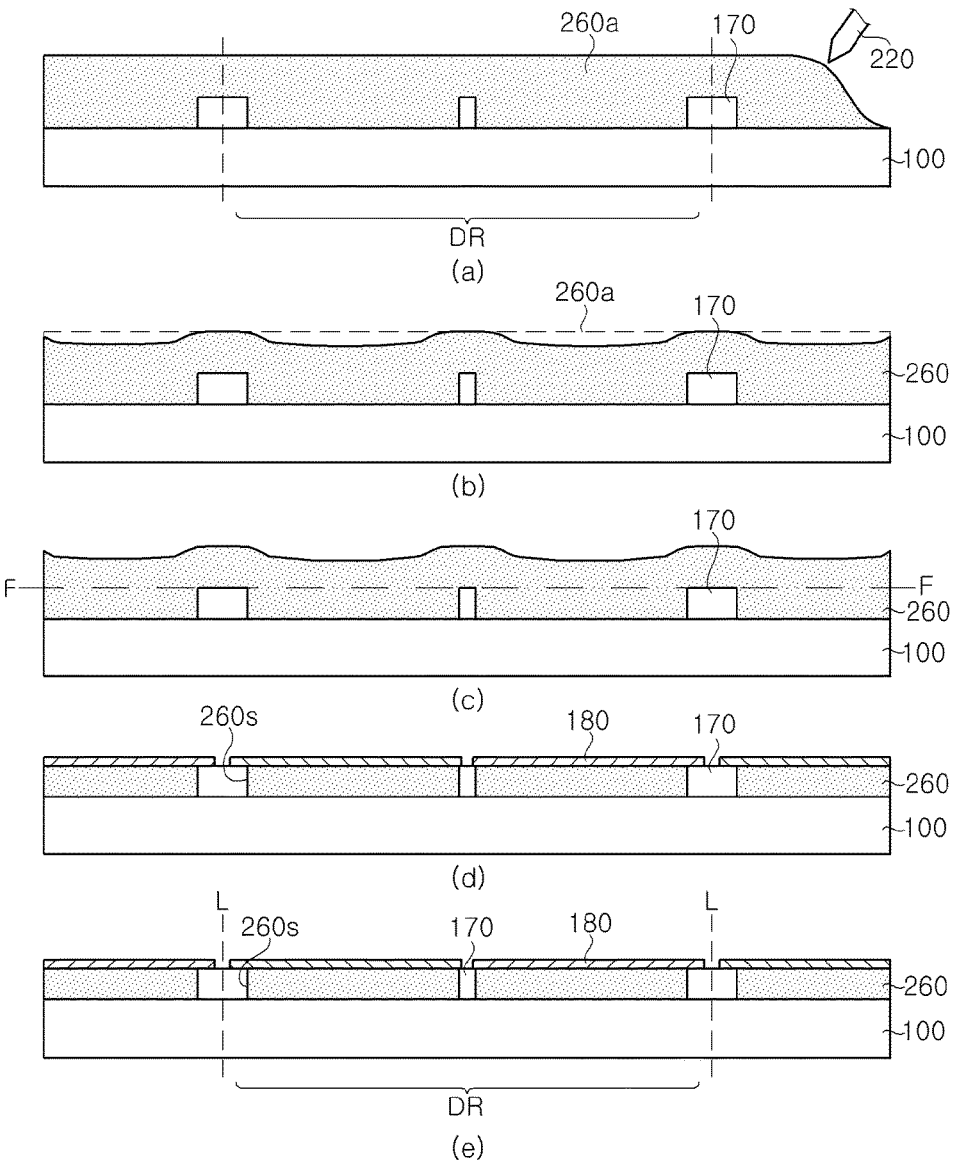
[Fig. 24]
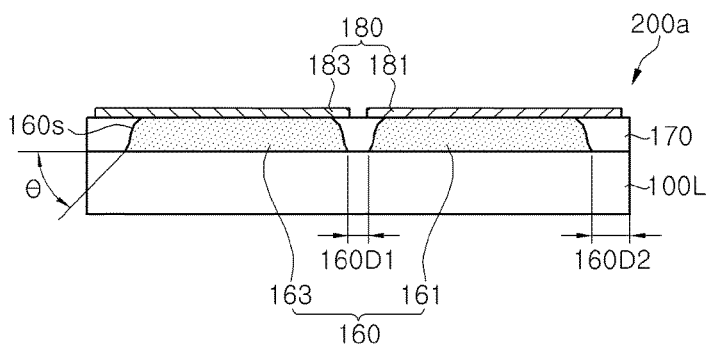

[Fig. 25]
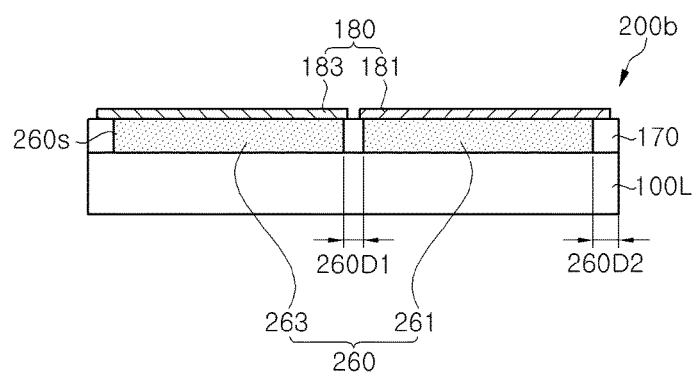
[Fig. 26]
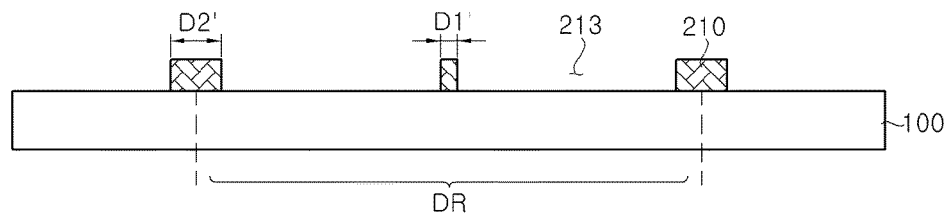

[Fig. 27]
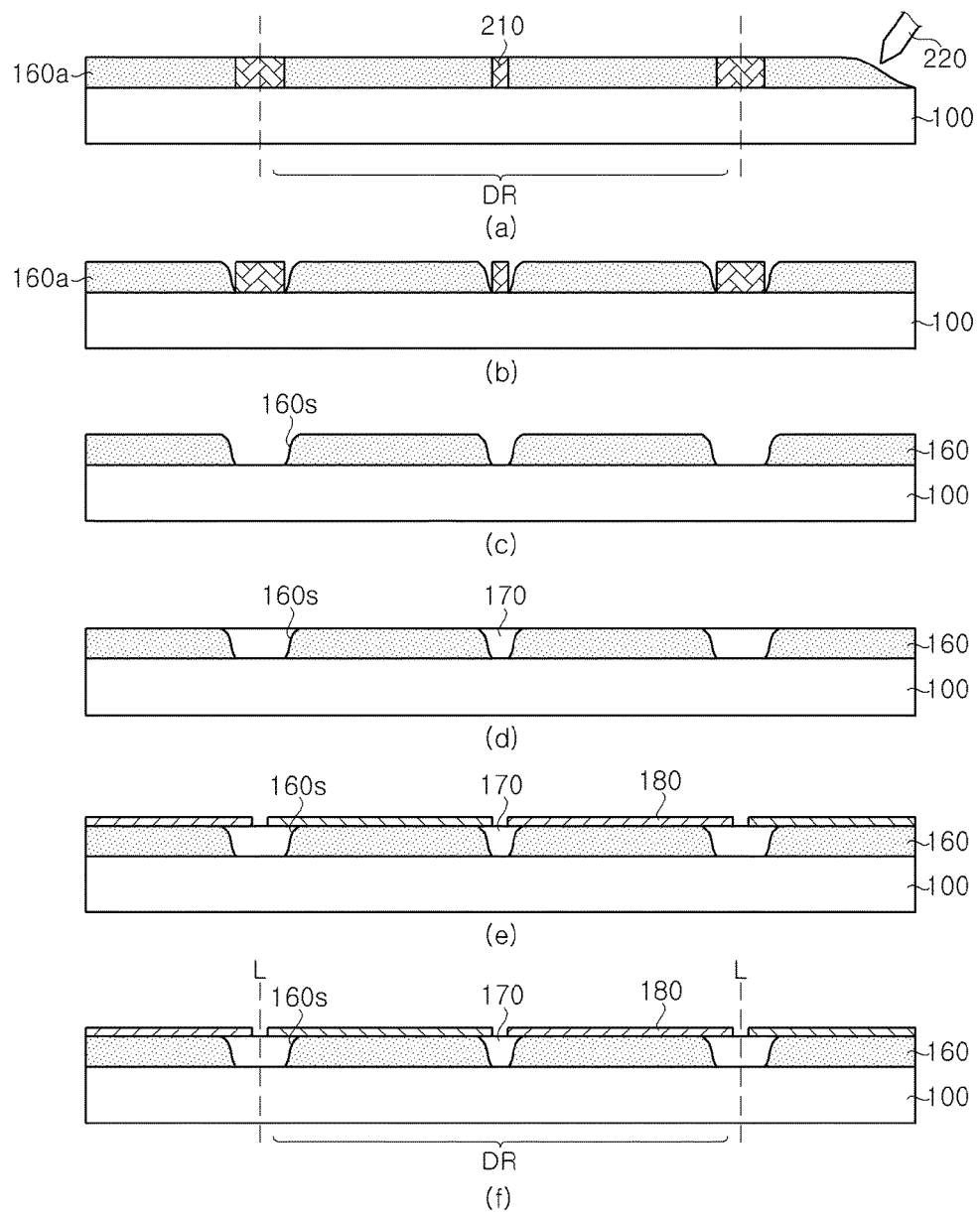

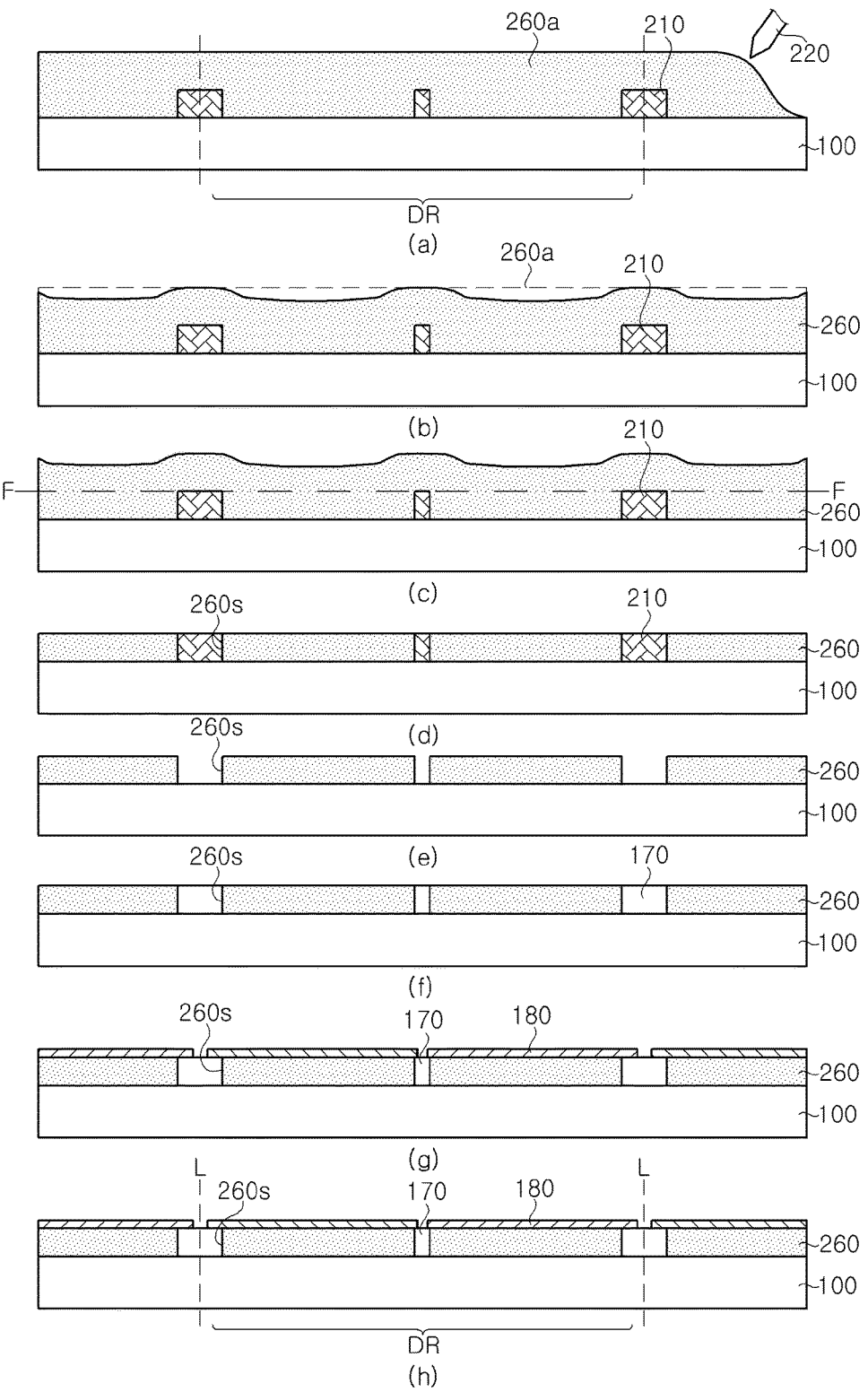
[Fig. 28]

[Fig. 29]
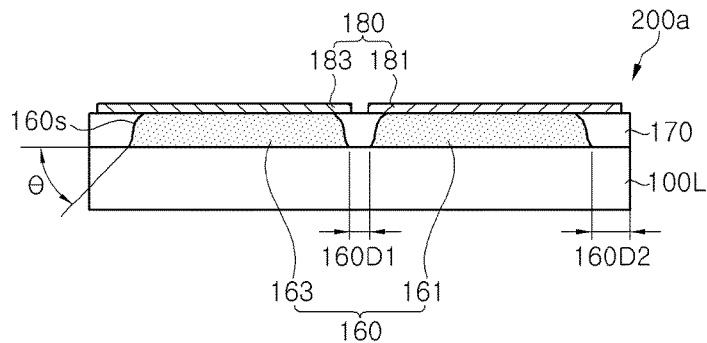
[Fig. 30]
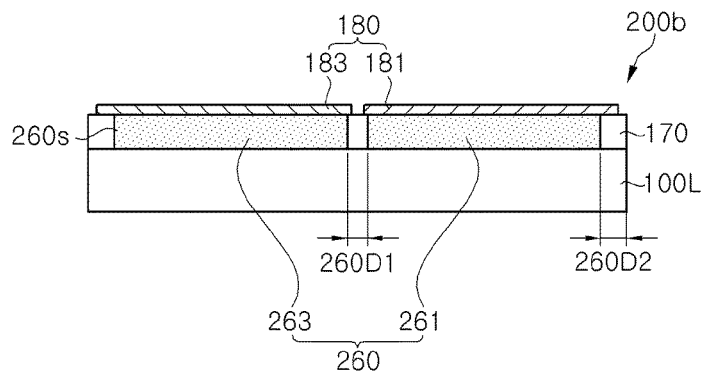
[Fig. 31]
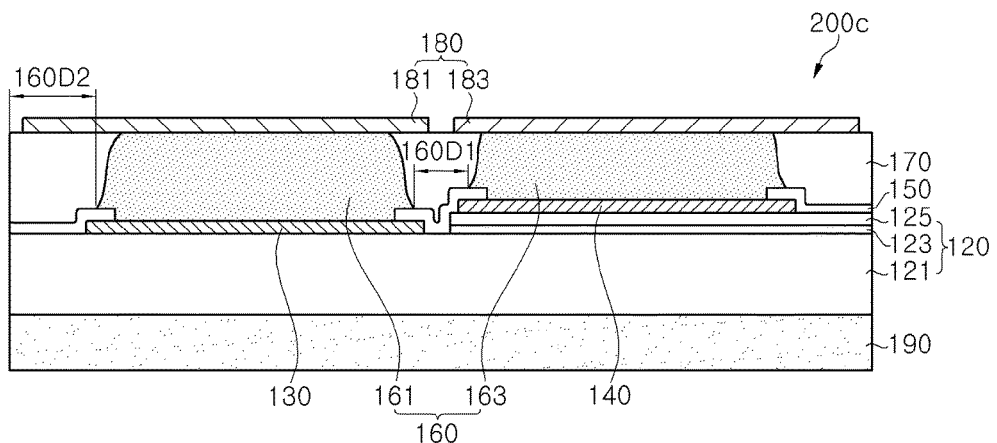

[Fig. 32]
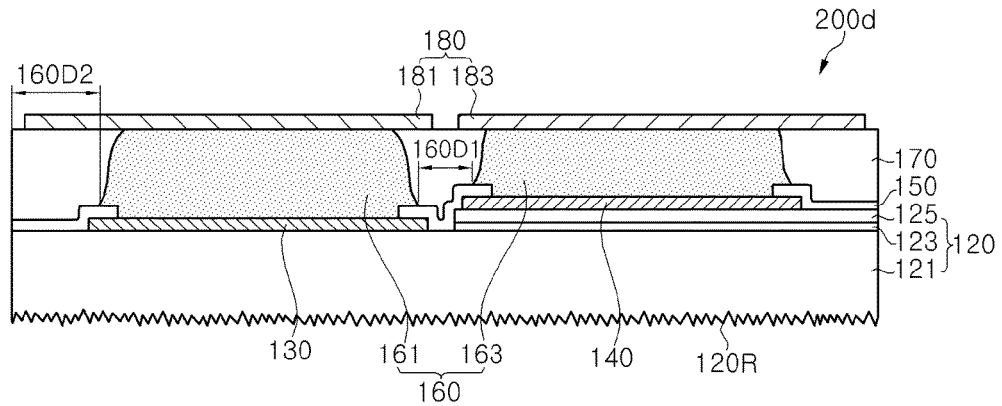
[Fig. 33]
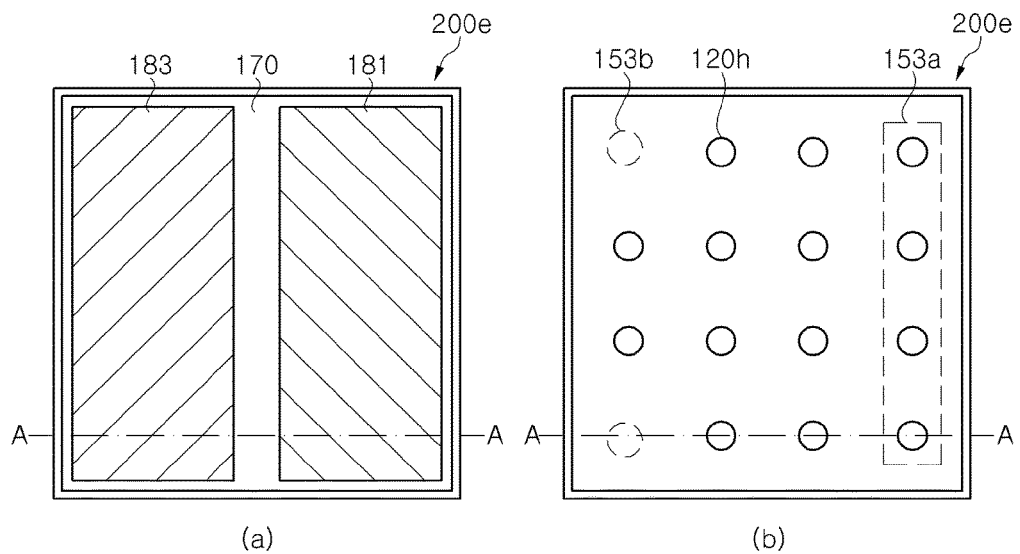
(a)　　　　　　　　　　　(b)
[Fig. 34]
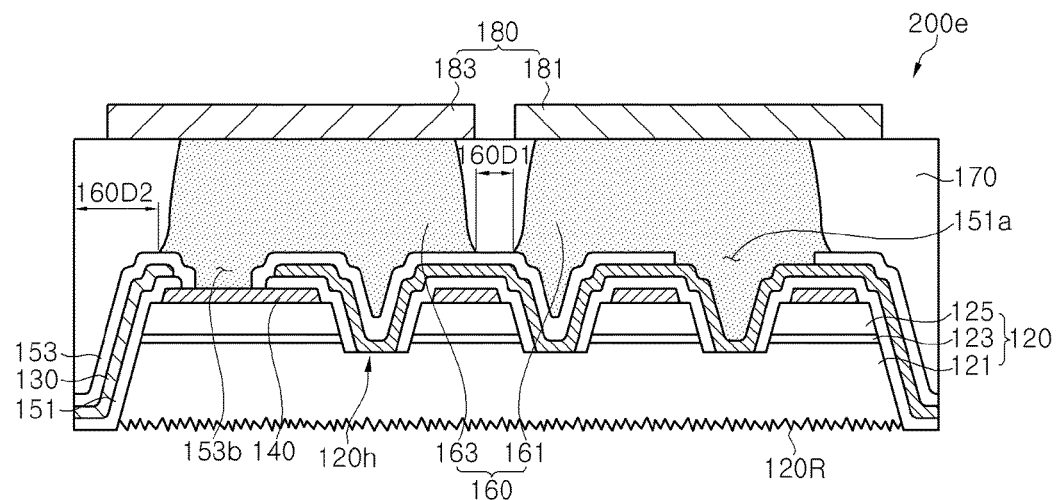

[Fig. 35]
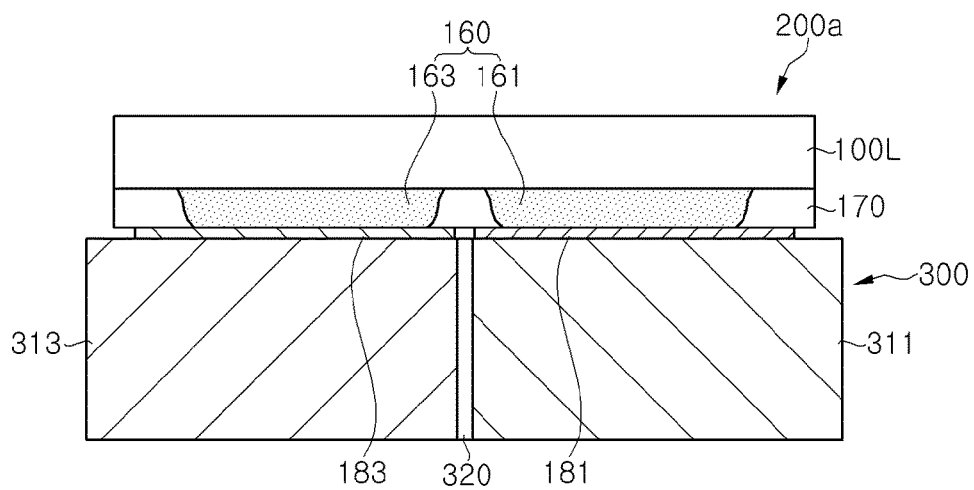
[Fig. 36]
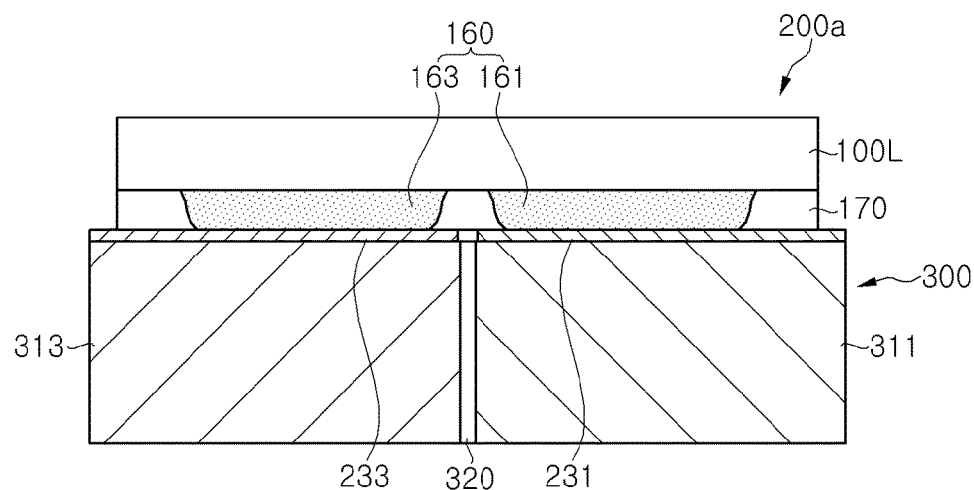

LIGHT EMITTING DEVICE AND METHOD OF FABRICATING THE SAME

CROSS REFERENCE TO RELATED APPLICATION

This patent document is a 35 U.S.C. § 371 National Stage application of PCT Application No. PCT/KR2015/009614, filed on Sep. 14, 2015, which further claims the benefits and priority of prior Korean Patent Application No. 10-2014-0129019, filed on Sep. 26, 2014, and prior Korean Patent Application No. 10-2014-0142580, filed on Oct. 21, 2014The entire disclosures of the above applications are incorporated by reference in their entirety as part of this document.

TECHNICAL FIELD

The present disclosure relates to a light emitting device and a method of fabricating the same, and more particularly, to a light emitting device having excellent mechanical properties and improved reliability and including electrodes having excellent thermal and electrical characteristics, and a method of fabricating the same.

BACKGROUND ART

Recently, with an increase in a demand for a small, high-output light emitting device, a demand for a large-area flip-chip type light emitting device having excellent heat dissipation efficiency has increased. Electrodes of the flip-chip type light emitting device are directly bonded to a secondary substrate, and a wire for supplying external power to the flip-chip type light emitting device is not used, such that the flip-chip type light emitting device has heat dissipation efficiency significantly higher than that of a horizontal type light emitting device. Therefore, even though a high density of current is applied, heat can be effectively conducted to the secondary substrate, such that the flip-chip type light emitting device is appropriate for a high output light source.

In addition, a demand for a chip scale package in which a process of packaging the light emitting device in a separate housing, or the like is omitted and the light emitting device itself is used as a package in order to miniaturize the light emitting device has increased. Particularly, the electrode of the flip-chip type light emitting device can perform a function similar to that of a lead of the package, such that the flip-chip type light emitting device can also be usefully utilized in the chip scale package.

DISCLOSURE OF INVENTION

Technical Problem

Exemplary embodiments of the disclosed technology provide a light emitting device having improved reliability by including an electrode having a new structure.

Exemplary embodiments of the disclosed technology provide a method of fabricating a light emitting device having improved reliability by forming an electrode using a sintering method.

Exemplary embodiments of the disclosed technology provide a light emitting device having improved reliability and excellent electrical characteristics and a method of fabricating the same.

Solution to Problem

According to an exemplary embodiment of the disclosed technology, a light emitting device includes: a light emitting structure including a first conductivity type semiconductor layer, a second conductivity type semiconductor layer, and an active layer disposed between the first conductivity type semiconductor layer and the second conductivity type semiconductor layer and including a first surface and a second surface disposed to be opposite to the first surface; a first electrode disposed on the first surface of the light emitting structure and electrically connected to the first conductivity type semiconductor layer; and a second electrode disposed on the first surface of the light emitting structure and electrically connected to the second conductivity type semiconductor layer, in which the first and second electrodes each include sintered metal particles and the first and second electrodes each include inclined sides of which the tangential gradients with respect to sides of vertical cross sections thereof are changing.

According to one embodiment of the disclosed technology, it is possible to provide the light emitting device including the electrode with improved mechanical stability.

The inclined side can include a region in which the tangential gradient is increased and a region in which the tangential gradient is reduced.

Horizontal cross sectional areas of each of the first and second electrodes can be gradually reduced toward a direction far away from the first surface of the light emitting structure.

The light emitting device can further include an insulating part covering sides of the first and second electrodes and the first surface of the light emitting structure, in which the first and second electrodes can be exposed on one surface of the insulating part.

The light emitting device can further include a first electrode pad and a second electrode pad disposed on the one surface of the insulating part and each disposed on the first and second electrodes.

Areas of the first and second electrode pads can each be larger than that of the first electrode exposed on the one surface of the insulating part and that of the second electrode exposed on the one surface of the insulating part.

The light emitting device can further include a wavelength conversion unit disposed on the second surface of the light emitting structure.

Sintered metal particles can include the plurality of metal particles and a nonmetallic material interposed between the metal particles.

The metal particle can include Ag.

Sintered metal particles can include the metal particles ranging from 80 to 98 wt %.

The light emitting device can further include: a region in which the first conductivity type semiconductor layer is partially exposed by partially removing the active layer and the second conductivity type semiconductor layer; a first contact electrode ohmic-contacting the first conductivity type semiconductor layer through the area in which the first conductivity type semiconductor layer is exposed and partially covering the first surface of the light emitting structure; a second contact electrode disposed on the second conductivity type semiconductor layer to ohmic-contact the second conductivity type semiconductor layer; a first insulating layer insulating the first and second contact electrodes from each other; and a second insulating layer partially covering the first and second contact electrodes and including a first opening part and a second opening part through which the first contact electrode and the second contact electrode are each exposed, in which the first and second electrodes each can directly contact the first and second contact electrodes through the first and second opening parts.

The region in which the first conductivity type semiconductor layer is exposed can include a plurality of holes.

The light emitting structure can include at least one mesa including the second conductivity type semiconductor layer and the active layer and the region in which the first conductivity type semiconductor layer is exposed can be disposed around the mesa.

The light emitting device can further include a first contact electrode and a second contact electrode ohmic-contacting each of the first conductivity type semiconductor layer and the second conductivity type semiconductor layer, in which the first electrode and the second electrode each can directly contact the first and second contact electrodes.

The light emitting device can further include a wavelength conversion unit disposed on the second surface of the light emitting structure.

The wavelength conversion unit can contact the first insulating layer.

The wavelength conversion unit can at least partially further covers a side of the first conductivity type semiconductor layer.

According to another exemplary embodiment of the disclosed technology, there is provided a light emitting device including: a light emitting structure including a first conductivity type semiconductor layer, a second conductivity type semiconductor layer, and an active layer disposed between the first conductivity type semiconductor layer and the second conductivity type semiconductor layer and including a first surface and a second surface disposed to be opposite to the first surface; a first electrode disposed on the first surface of the light emitting structure and electrically connected to the first conductivity type semiconductor layer; and a second electrode disposed on the first surface of the light emitting structure and electrically connected to the second conductivity type semiconductor layer, in which the first and second electrodes each include sintered metal particles and sintered metal particles can include metal particles ranging from 80 to 98 wt % and a nonmetallic material interposed between the metal particles.

According to still another exemplary embodiment of the disclosed technology, there is provided a method of fabricating a light emitting device including: forming a light emitting structure including a first conductivity type semiconductor layer, an active layer disposed on the first conductivity type semiconductor layer, and a second conductivity type semiconductor layer disposed on the active layer on a growth substrate; forming a pre first electrode and a pre second electrode electrically connected to the first and second conductivity type semiconductor layers, respectively and including metal particles on the light emitting structure; and forming a first electrode and a second electrode, respectively, by sintering the pre first electrode and the pre second electrode, in which the first and second electrodes each include inclined sides of which the tangential gradients with respect to sides of vertical cross sections thereof can be changing.

Volumes of the first and second electrodes can each be smaller than those of the pre first and second electrodes.

The inclined sides can include a region in which the tangential gradient is increased and a region in which the tangential gradient is reduced.

The forming of the pre first and second electrodes can include forming a viscous material including metal particles and a nonmetallic material interposed between the metal particles on the light emitting structure using a dispensing or applying method.

The dispensing or applying method can include a dotting or screen printing method.

The method can further include forming an insulating part covering the first and second electrodes on the light emitting structure.

The method of fabricating a light emitting device can include exposing the first electrode and the second electrode on one surface of the insulating part by partially removing the first and second electrodes and the insulating part.

The method of fabricating a light emitting device can further include forming the first electrode pad and the second electrode pad each contacting the first electrode and the second electrode on the one surface of the insulating part.

The method of fabricating a light emitting device can further include: after the forming of the first and second electrodes, separating the growth substrate from the light emitting structure; and forming a wavelength conversion unit on one surface of the light emitting structure exposed by separating the growth substrate therefrom.

The forming of the light emitting structure can include forming a first contact electrode and a second contact electrode ohmic-contacting each of the first conductivity type semiconductor layer and the second conductivity type semiconductor layer, in which the pre first electrode and the pre second electrode can each contact the first and second contact electrodes.

According to yet another exemplary embodiment of the disclosed technology, there is provided a light emitting device including: a light emitting structure including a first conductivity type semiconductor layer, a second conductivity type semiconductor layer, and an active layer disposed between the first conductivity type semiconductor layer and the second conductivity type semiconductor layer and including a first surface and a second surface opposite to the first surface; first and second contact electrodes disposed on the first surface of the light emitting structure and each ohmic-contacting the first and second conductivity type semiconductor layers; a first electrode and a second electrode disposed on the first surface of the light emitting structure and each electrically connected to the first contact electrode and the second contact electrode; and an insulating part covering sides of the first and second electrodes and the first surface of the light emitting structure, in which the first and second electrodes can each include metal particles and a half value of a shortest distance of an interval between the first electrode and the second electrode can be smaller than a shortest distance from one side of one of the first electrode and the second electrode to an outer side of the insulating part.

The shortest distance between the first electrode and the second electrode can range from 10 to 80 μm.

The first and second electrodes can each include the inclined sides of which the tangential gradients with respect to the sides of the vertical cross sections thereof are changing.

An angle formed by the sides of the first electrode and the second electrode and an upper surface of the light emitting structure can range from 30° or more to less than 90°.

The sides of each of the first electrode and the second electrode can be perpendicular to the first side of the light emitting structure.

The light emitting device can further include the first electrode pad and the second electrode pad disposed on the one surface of the insulating part and each disposed on the first and second electrodes.

The first and second electrodes can each include the metal particles and the nonmetallic material interposed between the metal particles.

The first and second electrodes can each include the metal particles of 80 to 98 wt %.

The metal particle can include at least one of Cu, Au, Ag, and Pt.

The light emitting device can further include: a region in which the first conductivity type semiconductor layer is partially exposed by partially removing the active layer and the second conductivity type semiconductor layer; a first insulating layer insulating the first and second contact electrodes from each other; and a second insulating layer partially covering the first and second contact electrodes and including a first opening part and a second opening part through which the first contact electrode and the second contact electrode are each exposed, in which the first contact electrode can ohmic-contact the first conductivity type semiconductor layer through a region in which the first conductivity type semiconductor layer is exposed and the first and second electrodes each can directly contact the first and second contact electrodes through the first and second opening parts.

The first electrode and the second electrode each can directly contact the first and second contact electrodes.

Advantageous Effects of Invention

According to the exemplary embodiments of the disclosed technology, it is possible to provide the light emitting device having the electrode including sintered metal particles to improve the mechanical stability of the electrode and the reliability of the semiconductor layers, thereby improving the reliability of the light emitting device. Further, it is possible to provide the method of fabricating a light emitting device capable of stabilizing and simplifying the process by providing the method of forming an electrode using the sintering method.

Further, it is possible to reduce the shortest distance between the electrodes by forming the electrode using the mask or the insulating part as a kind of frame in the process of fabricating a light emitting device, thereby improving the electrical and thermal characteristics of the light emitting device.

BRIEF DESCRIPTION OF DRAWINGS

FIG. 1 is a cross-sectional view for describing a general flip-chip type light emitting device.

FIGS. 2(a) and 2(b) are a plan view and a cross-sectional view for describing a light emitting device according to exemplary embodiments of the disclosed technology.

FIGS. 3(a) and 3(b) and 4 are plan views and a cross-sectional view for describing a light emitting device according to another exemplary embodiment of the disclosed technology.

FIG. 5 is a cross-sectional view for describing a light emitting apparatus according to another exemplary embodiment of the disclosed technology.

FIG. 6 is a cross-sectional view for describing a light emitting apparatus according to another exemplary embodiment of the disclosed technology.

FIGS. 7 to 20 are plan views and cross-sectional views for describing a method of fabricating a light emitting device according to other exemplary embodiments of the disclosed technology.

FIGS. 21 to 25 are cross-sectional views for describing a method of fabricating a light emitting device according to another exemplary embodiment of the disclosed technology.

FIGS. 26 to 30 are cross-sectional views for describing a method of fabricating a light emitting device according to another exemplary embodiment of the disclosed technology.

FIG. 31 is a cross-sectional view for describing a light emitting device according to another exemplary embodiment of the disclosed technology.

FIG. 32 is a cross-sectional view for describing a light emitting device according to another exemplary embodiment of the disclosed technology.

FIGS. 33 and 34 are plan views and a cross-sectional view for describing a light emitting device according to still another exemplary embodiment of the disclosed technology.

FIG. 35 is a cross-sectional view for describing a light emitting apparatus according to another exemplary embodiment of the disclosed technology.

FIG. 36 is a cross-sectional view for describing a light emitting apparatus according to another exemplary embodiment of the disclosed technology.

MODE FOR THE INVENTION

FIG. 1 illustrates a general form of a flip chip type light emitting device. Referring to FIG. 1, the flip chip type light emitting device can include an n type semiconductor layer 11, an active layer 13, a p type semiconductor layer 15, an n type pad 21 and a p type pad 23 each disposed on the n type and p type semiconductor layers, and an n type electrode 41 and a p type electrode 43 each disposed on the n type pad 21 and the p type pad 23 and electrically connected to each other. For the flip-chip type light emitting device to be applied to a chip scale package, the n type electrode 21 and the p type electrode 23 need to have a thickness ranging from several tens of μm to several hundreds of μm. In the case of using an evaporation method such as electron-beam evaporation, a growth speed of metal is very slow, such that productivity of the light emitting device can be greatly reduced. Accordingly, to implement the electrodes having the foregoing thickness, the n type electrode and the p type electrode 23 can be formed by a plating method.

However, in the case of forming the electrodes using the plating method, the semiconductor layer is applied with a stress due to metal during the plating, and thus the semiconductor layer can go through deformations such as bowing and can be cracked or damaged. Further, to use the plating method, separate seed layers 30 need to be interposed between pads and the electrodes as illustrated in FIG. 1, Therefore, a method of forming an electrode using the plating method can have a complicated process, such that productivity of the light emitting device can be reduced.

Further, to apply the flip-chip type light emitting device to the chip scale package, insulators are formed to cover sides of the n type and the p type electrodes 21 and 23. There can be a problem in that a gap is formed between the electrode formed using the plating method and the insulator due to an interface angle between the electrode and the insulator. The light emitting device can have a defect due to the gap, such that the reliability of the light emitting device can be reduced.

Hereinafter, exemplary embodiments of the disclosed technology will be described in detail with reference to the accompanying drawings. Exemplary embodiments to be provided below are provided by way of example so that the spirit of the disclosed technology can be sufficiently transferred to those skilled in the art to which the disclosed technology pertains. Therefore, the disclosed technology is not limited to the exemplary embodiments set forth herein but can be modified in many different forms. In the accompanying drawings, widths, lengths, thicknesses, or the like, of components can be exaggerated for convenience. In addition, it will be understood that when one component is referred to as being "on" another component, one component can be directly on another component or can have the other component interposed therebetween. Like reference numerals denote like elements throughout the specification.

FIGS. 2(a) and 2(b) are a plan view and a cross-sectional view for describing a light emitting device according to an exemplary embodiment of the disclosed technology.

FIG. 2(a) is a plan view of a light emitting device 100 and FIG. 2(b) is a cross-sectional view taken along the line S-S of FIG. 2(a).

Referring to FIGS. 2(a) and 2(b), the light emitting device 100 can include a light emitting unit 100L and an electrode 160 and can further include an insulating part 170, first and second electrode pads 181 and 183, and a wavelength conversion unit 190.

The light emitting unit 100L can include the light emitting structure including a first conductivity type semiconductor layer and a second conductivity type semiconductor layer and an active layer disposed between the first and second conductivity type semiconductor layers. The light emitting unit 100L can be connected to an external power supply to emit light having a desired wavelength.

The light emitting structure can include a first surface and a second surface opposite to the first surface. Here, a first electrode 161 and a second electrode 163 can be disposed on the first surface. For example, according to the exemplary embodiment of the disclosed technology, in the drawing, a lower surface of the light emitting unit 100L can be defined as the first surface of the light emitting structure and an upper surface of the light emitting unit 100L can be defined as the second surface of the light emitting structure. However, the disclosed technology is not limited thereto.

The light emitting unit 100L and the light emitting structure can have various forms such as a structure in which the first electrode 161 and the second electrode 163 can extend downwardly. For example, the light emitting unit 100L and the light emitting structure can have a flip-chip type having a general structure as illustrated in FIG. 1 and a type as illustrated in FIG. 4. This will be described below in detail.

The electrode 160 can be disposed on the first surface of the light emitting structure and can include the first electrode 161 and the second electrode 163. In this case, the first electrode 161 and the second electrode 163 each can be electrically connected to the first conductivity type semiconductor layer and the second conductivity type semiconductor layer of the light emitting structure and the first and second electrodes 161 and 163 can directly contact the light emitting structure.

The first electrode 161 and the second electrode 163 can each include an inclined side. In particular, as illustrated, the first electrode 161 and the second electrode 163 can each include inclined sides of which the tangential TL gradients with respect to sides of vertical cross sections thereof are changing. In detail, as illustrated in FIGS. 2(a) and 2(b), the tangential TL gradients with respect to the sides of the vertical cross sections of each of the first electrode 161 and the second electrode 163 can be increased from bottom toward top and then can again be decreased by passing through a certain point of inflection. Therefore, the inclined sides of each of the first electrode 161 and the second electrode 163 can include a region in which the tangential TL gradient is increased and a region in which the tangential TL gradient is reduced.

The first electrode 161 and the second electrode 163 can each include the inclined sides of which the tangential TL gradients with respect to the sides of the vertical cross sections thereof are changing, such that horizontal cross sectional areas of the first electrode 161 and the second electrode 163 can be changed vertically. For example, as illustrated, the horizontal cross sectional areas of each of the first electrode 161 and the second electrode 163 can be reduced toward a direction far away from one surface of the light emitting unit 100L, that is, the first surface of the light emitting structure.

Therefore, the shape of the first electrode 161 and the second electrode 163 can each be determined to have the foregoing shaped sides. For example, the first electrode 161 and the second electrode 163 can have a similar form to a truncated arch shape. The first electrode 161 and the second electrode 163 can each include the inclined sides of which the tangential TL gradients with respect to the sides of the vertical cross sections thereof are changing, such that mechanical stability at the interface of the insulating part 170 with the first electrode 161 and the second electrode 163 can be improved.

The first electrode 161 and the second electrode 163 can include a plurality of metal particles 160m. Further, the first and second electrodes 161 and 163 can each include sintered metal particles, in which the sintered metal particles can include metal particles 160m and a nonmetallic material 160n interposed between the metal particles 160m. In an enlarged view of FIG. 2(b), the metal particles 160m are sintered and thus can be formed in a form in which a plurality of grains are disposed and the nonmetallic material 160n can be interposed in at least some region between the metal particles 160m. The nonmetallic material 160n can serve as a buffer to reduce a stress applying to the first electrode 161 and the second electrode 163. Therefore, the mechanical stability of the first electrode 161 and the second electrode 163 can be improved, and thus the stress which can be applied from the electrode 160 to the light emitting unit 100L can be reduced.

The metal particles 160m of each of the first electrode 161 and the second electrode 163 can be included at a ratio of 80 to 98 wt % compared with total masses of each of the first and second electrodes 161 and 163.

Further, when the first electrode 161 and the second electrode 163 each include sintered metal particles, the metal particles 160m can be included at a ratio of 80 to 98 wt % compared with the total mass of the metal particle sintered body. Sintered metal particles can include the metal particles 160m of the foregoing ratio to have excellent thermal conductivity and electrical conductivity and can effectively buffer the stress applying to the electrode 160 to improve the mechanical stability of the electrode 160.

The metal particles 160m can include materials having thermal conductivity and electrical conductivity without any limitation. For example, the metal particles 160m can include Cu, Au, Ag, Pt, etc. The nonmetallic material 160n can be induced from materials to be sintered for forming the electrode 160. For example, the nonmetallic material 160n can be a polymer material including C.

According to the foregoing exemplary embodiment, the metal particles 160m is described as those included in the first and second electrodes 161 and 163 in sintered metal particles form, but the disclosed technology is not limited thereto.

Further, the first electrode 161 and the second electrode 163 can have a thickness ranging from about 50 to 80 μm. The light emitting device according to the exemplary embodiment of the disclosed technology includes the electrode 160 having the thickness within the foregoing range, and as a result the light emitting device itself can be used as a chip scale package. Further, the electrode 160 includes sintered metal particles, such that even though the electrode 160 is formed at the thickness within the foregoing range, the applied stress can be sufficiently relieved. Therefore, the stress applied to the light emitting unit 100L is reduced, such that the mechanical stability and reliability of the light emitting device can be improved. However, the thickness of the electrode 160 is not limited to the foregoing range.

Further, the light emitting device can further include first and second contact electrodes (not illustrated) disposed between the first electrode 161 and the second electrode 163 and the light emitting structure of the light emitting unit 100L. The first and second contact electrodes can each ohmic-contact the first and second conductivity type semiconductor layers, respectively. In this case, the first electrode 161 and the second electrode 163 each can directly contact the first contact electrode and the second contact electrode. That is, the first electrode 161 and the second electrode 163 each can be formed to directly contact the first and second contact electrodes. Accordingly, additional components such as a seed layer required for the plating method and a wetting layer required for a solder can be omitted.

The insulating part 170 can be formed to cover the lower surface of the light emitting unit 100L, that is, the side of the electrode 160 on the first surface of the light emitting structure. The first electrode 161 and the second electrode 163 can be exposed on a lower surface of the insulating part 170.

The insulating part 170 can have an electrical insulating property and cover the sides of the first and second electrodes 161 and 163 to effectively insulate the first and second electrode 161 and 163 from each other. In addition, the insulating part 170 can serve to support the first and second electrodes 161 and 163. The lower surface of the insulating part 170 can be formed to be substantially flush with the lower surfaces of the first electrode 161 and the second electrode 163.

The insulating part 170 can include insulating polymer and/or insulating ceramic, for example, materials such as an epoxy molding compound and/or Si resin. In addition, the insulating part 170 can also include light-reflective and light scattering particles such as $TiO_2$ particles. The insulating part 170 has reflectivity to reflect light emitting from the light emitting unit 100L upwardly, thereby improving light efficiency of the light emitting device.

Further, unlike that illustrated, the insulating part 170 can further cover the side of the light emitting unit 100L and some of the insulating part 170 can also contact the wavelength conversion unit 190. In this case, a light emitting angle of the light emitted from the light emitting unit 100L can be changed. Further, when the insulating part 170 further covers the side of the light emitting unit 100L, some of the light emitted to the side of the light emitting unit 100L can be reflected upwardly. As described above, a region in which the insulating part 170 is disposed is adjusted, such that the light emitting angle of the light emitting device 100 can be adjusted.

The first electrode pad 181 and the second electrode pad 183 can be disposed on one surface of the insulating part 170. In particular, as illustrated, the first electrode pad 181 and the second electrode pad 183 can be disposed on the lower surface of the insulating part 170 on which the first and second electrodes 161 and 163 are exposed, among the one surfaces of the insulating part 170.

The first and second electrode pads 181 and 183 each can electrically contact the first and second electrodes 161 and 163 or can be spaced apart from each other. When the light emitting device is applied for a module, etc., the first and second electrodes 161 and 163 can make the light emitting device be more stably mounted on a substrate of the module. For example, when the first and second electrodes 161 and 163 include a Cu or Ag particle sintered body, the lower surfaces of the first and second electrodes 161 and 163 can have poor wettability with the solder. Therefore, the first and second electrode pads 181 and 183 can further be disposed on the lower surface of the insulating part 170, such that the light emitting device can be stably mounted.

Meanwhile, as illustrated in FIG. 2(a), horizontal areas of each of the first and second electrode pads 181 and 183 can be larger than those of the first and second electrodes 161 and 163 exposed on the lower surface of the insulating part 170. As a result, a region in which the first and second electrodes 161 and 163 are exposed can each be disposed within a region in which the first and second electrode pads 181 and 183 are formed.

Areas of each of the first and second electrode pads 181 and 183 are formed to be larger than those of the regions of the first and second electrodes 161 and 163 exposed on the lower surface of the insulating part 170, such that the light emitting device can be more stably mounted on the separate additional substrate.

The first and second electrode pads 181 and 183 can include conductive materials such as metal, for example, Ni, Pt, Pd, Rh, W, Ti, Al, Ag, Sn, Cu, Ag, Bi, In, Zn, Sb, Mg, Pb, etc. Further, each of the first and second electrode pads 181 and 183 can be formed of a single layer structure or a multilayer structure.

The wavelength conversion unit 190 can be disposed on the upper surface of the light emitting unit 100L, that is, the second surface of the light emitting structure.

The wavelength conversion unit 190 can convert a wavelength of the light emitted from the light emitting unit 100L to let the light emitting device to emit light having a desired wavelength band. The wavelength conversion unit 190 can include a phosphor and a carrier in which the phosphor is carried. The phosphor can include various phosphors well-known in those skilled in the art, and can include at least one of, for example, a garnet phosphor, an aluminate phosphor, a sulfide phosphor, an oxynitride phosphor, a nitride phosphor, a fluoride-based phosphor, and a silicate phosphor. As the carrier, materials well known to those skilled in the art can also be used. For example, the carrier can include polymer resin such as epoxy resin or acrylic resin or silicon resin. In addition, the wavelength conversion unit 190 can be formed of a single layer structure or a multilayer structure.

As illustrated in FIGS. 2(a) and 2(b), the wavelength conversion unit 190 can be formed to cover the upper surface of the light emitting unit 100L and the disclosed technology is not limited thereto. The wavelength conversion unit 190 can further cover the side of the light emitting unit 100L and can further cover the side of the insulating part 170. When the wavelength conversion unit 190 covers the side of the insulating part 170, the upper surface of the light emitting device and a side of at least some thereof are covered with the wavelength conversion unit 190.

FIGS. 3(a), 3(b) and 4 are plan views and a cross-sectional view for describing a light emitting device according to another exemplary embodiment of the disclosed technology. The structure of the light emitting unit will be exemplarily described in detail with reference to FIGS. 3(a), 3(b) and 4. However, the disclosed technology is not limited to a structure and a configuration to be below.

FIG. 3(a) is a plan view of the light emitting device, FIG. 3(b) is a plan view for describing positions of holes 120h and positions of third and fourth opening parts 153a and 153b, and FIG. 4 is a cross-sectional view illustrating a cross section of a region corresponding to the line A-A of FIGS. 3(a) and 3(b).

Referring to FIGS. 3(a), 3(b) and 4, a light emitting device 100a can include a light emitting structure 120 including a first conductivity type semiconductor layer 121, an active layer 123, and a second conductivity type semiconductor layer 125, a first contact electrode 130, a second contact electrode 140, a first insulating layer 151, a second insulating layer 153, the first electrode 161, and the second electrode 163. Further, the light emitting device 100a can further include the insulating part 170, the first and second electrode pads 181 and 183, the growth substrate (not illustrated), and the wavelength conversion unit 190.

The light emitting structure 120 can include the first conductivity type semiconductor layer 121, the active layer 123 disposed on the first conductivity type semiconductor layer 121, and the second conductivity type semiconductor layer 125 disposed on the active layer 123. The first conductivity type semiconductor layer 121, the active layer 123, and the second conductivity type semiconductor layer 125 can include a III-V based compound semiconductor, for example, a nitride based semiconductor such as (Al, Ga, In)N. The first conductivity type semiconductor layer 121 can include n-type impurities (for example, Si), and the second conductivity type semiconductor layer 125 can include p type impurities (for example, Mg). Further, they can be the opposite. The active layer 123 can include a multiple quantum well structure (MQW).

In addition, the light emitting structure 120 can include a region in which the first conductivity type semiconductor layer 121 is partially exposed by partially removing the second conductivity type semiconductor layer 125 and the active layer 123. For example, as illustrated, the light emitting structure 120 can include at least one hole 220h penetrating through the second conductivity type semiconductor layer 125 and the active layer 123 to expose the first conductivity type semiconductor layer 121. However, the disclosed technology is not limited thereto. That is, an arrangement form of the holes 220h and the number of holes 220h can be variously modified.

In addition, the form in which the first conductivity type semiconductor layer 121 is exposed is not limited to a form such as the hole 120h. For example, the region in which the first conductivity type semiconductor layer 121 is exposed can be formed in a line form, a combined form of holes and lines, or the like. When the region in which the first conductivity type semiconductor layer 121 is exposed is formed in the plurality of line forms, the light emitting structure 120 can be formed along the line and can also include at least one mesa including the active layer 123 and the second conductivity type semiconductor layer 125.

The second contact electrode 140 is disposed on the second conductivity type semiconductor layer 125. The second contact electrode 140 can at least partially cover the upper surface of the second conductivity type semiconductor layer 125 and ohmic-contact the second conductivity type semiconductor layer 125. Further, the second contact electrode 140 can generally cover the upper surface of the second conductivity type semiconductor layer 125 and can be formed as a single body. Therefore, a current can be uniformly supplied to the entire light emitting structure 120, such that current dispersion efficiency can be improved.

However, the disclosed technology is not limited thereto. Therefore, the second contact electrode 140 cannot be integrally formed and a plurality of unit reflective electrode layers can also be disposed on the upper surface of the second conductivity type semiconductor layer 125.

The second contact electrode 140 can include a material that can ohmic-contact the second conductivity type semiconductor layer 125, and can include, for example, a metal material and/or a conductive oxide.

When the second contact electrode 140 includes the metal material, the second contact electrode 140 can include a reflecting layer and a cover layer covering the reflecting layer. As described above, the second contact electrode 140 can serve to reflect light simultaneously with ohmic-contacting the second conductivity type semiconductor layer 125. Therefore, the reflecting layer can include metal that can ohmic-contact the second conductivity type semiconductor layer 125 while having high reflectivity. For example, the reflecting layer can include at least one of Ni, Pt, Pd, Rh, W, Ti, Al, Mg, Ag, and Au. In addition, the reflecting layer can include a single layer or multi layers.

The cover layer can prevent a mutual diffusion between the reflecting layer and other materials and prevent the reflecting layer from being damaged due to a diffusion of other external materials to the reflecting layer. Therefore, the cover layer can be formed to cover a lower surface and sides of the reflecting layer. The cover layer can be electrically connected to the second conductivity type semiconductor layer 125 together with the reflecting layer to serve as a kind of electrode together with the reflecting layer. The cover layer can include, for example, Au, Ni, Ti, Cr, or the like, and include a single layer or multi layer.

Meanwhile, when the second contact electrode 140 includes the conductive oxide, the conductive oxide can be ITO, ZnO, AZO, IZO, GZO or the like.

The first insulating layer 151 can partially cover the upper surface of the light emitting structure 120 and the second contact electrode 140. Further, the first insulating layer 151 can cover sides of the plurality of holes 120h but exposes upper surfaces of the holes 120h to partially expose the first conductivity type semiconductor layer 121. Further, the first insulating layer 151 can further cover at least some of the side of the light emitting structure 120.

Meanwhile, how much the side of the light emitting structure 120 is covered with the first insulating layer 151 can be changed depending on chip unit isolation in a process of fabricating the light emitting device, which will be described below in detail.

The first insulating layer 151 can include a first opening part disposed at a portion corresponding to the plurality of holes 120h and a second opening part exposing some of the second contact electrode 140. The first conductivity type semiconductor layer 121 can be partially exposed through the first opening part and the holes 120h and the second contact electrode 140 can be partially exposed through the second opening part.

The first insulating layer 151 can include an insulating material, for example, $SiO_2$, $SiN_x$, $MgF_2$, or the like. Further, the first insulating layer 151 can include a multilayer structure, and can also include a distributed Bragg reflector in which materials having different refractive indices are alternately stacked. In particular, when the second contact electrode 140 includes the conductive oxide, the first insulating layer 151 can include the distributed Bragg reflector, thereby improving the light emitting efficiency.

The first contact electrode 130 can partially cover the light emitting structure 120 and can ohmic-contact the first conductivity type semiconductor layer 121 through the plurality of holes 120h and the first opening parts. In this case, the holes 120h can be filled with the first contact electrode 130. The first contact electrode 130 can be formed to generally cover other portions except for some region of the lower surface of the first insulating layer 151. In addition, the first contact electrode 130 can be formed to cover the side surface of the light emitting structure 120. When the first contact electrode 130 is also formed on the side of the light emitting structure 120, the first contact electrode 130 can reflect upwardly light emitted from the active layer 123 to the side surface to increase a ratio of the light emitted to the upper surface of the light emitting device 100a. Meanwhile, the first contact electrode 130 cannot be formed in a region corresponding to the second opening part of the first insulating layer 151 but can be insulated from the second contact electrode while being spaced apart from the second contact electrode 140.

The first contact electrode 130 can be formed to generally cover the upper surface of the light emitting structure 120 except for some region of the light emitting structure, thereby more improving the current dispersion efficiency. In addition, the first contact electrode 130 can cover the portion that is not covered by the second contact electrode 140 to more effectively reflect light, thereby improving the light emitting efficiency of the light emitting device 100a.

The first contact electrode 130 can serve to reflect the light simultaneously with ohmic-contacting the first conductivity type semiconductor layer 121. Therefore, the first contact electrode 130 can be formed of a single layer structure or a multilayer structure and can include a high reflective metal layer such as an Al layer. The high reflective metal layer can be formed on an adhesion layer made of Ti, Cr, Ni, or the like. However, the disclosed technology is not limited thereto.

The first contact electrode 130 ohmic-contacts the first conductivity type semiconductor layer 121 through the holes 120a, such that the region in which the active layer 123 is removed is the same as the region corresponding to the plurality of holes 120h to form the electrode, etc., connected to the first conductivity type semiconductor layer 121. Therefore, the region in which the first conductivity type semiconductor layer 121 ohmic-contacts the metal layer can be minimized and a light emitting diode in which a ratio of the area of the light emitting region to the entire horizontal area of the light emitting structure is relatively large can be provided.

The light emitting device 100a can further include the second insulating layer 153 which can cover the first contact electrode 130. The second insulating layer 153 can include a third opening part 153a through which the first contact electrode 130 is partially exposed and a fourth opening part 153b through which the second contact electrode 140 is partially exposed. In this case, the fourth opening part 153b can be formed at a position corresponding to a second opening part 151b.

The number of each of the third and fourth opening parts 153a and 153b can be one or more. Further, as illustrated in FIG. 3(b), when the third opening part 153a is disposed to be adjacent to a corner of one side of the light emitting device 100a, the fourth opening part 153b can be disposed to be adjacent to other corners of the light emitting device.

The second insulating layer 153 can include an insulating material, for example, $SiO_2$, $SiN_x$, $MgF_2$, or the like. Further, the second insulating layer 153 can include a multilayer structure, and can also include the distributed Bragg reflector in which materials having different refractive indices are alternately stacked.

The first electrode 161 and the second electrode 163 can be disposed on the second insulating layer 153. Further, the first electrode 161 can be disposed on the third opening part 153a to contact the first contact electrode 130 and the second electrode 163 can be disposed on the fourth opening part 153b to contact the second contact electrode 140.

As such, the first electrode 161 and the second electrode 163 each can directly contact the first and second contact electrodes 130 and 140 Therefore, the additional seed layer or wetting layer can be omitted prior to forming the first electrode 161 and the second electrode 163, thereby simplifying the process of fabricating a light emitting device.

The description of the first electrode 161 and the second electrode 163 is similar to that described with reference to FIG. 2 and therefore the detailed description thereof will be omitted.

The insulating part 170 can cover the second insulating layer 153 and the sides of the first and second electrodes 161 and 163. In particular, as illustrated, the insulating part 170 can further cover the side of the light emitting structure 120.

Meanwhile, how much the side of the light emitting structure 120 is covered with the insulating part 170 can be changed depending on the chip unit isolation in the process of fabricating the light emitting device, which will be described below in detail.

The description of the insulating part 170, the first electrode pad 181, and the second electrode pad 183 is generally similar to that described with reference to FIG. 2 and therefore the detailed description thereof will be omitted.

The wavelength conversion unit 190 can be disposed on the lower surface of the light emitting structure 120. Some of the wavelength conversion unit 190 can also contact the first insulating layer 151. Further, unlike that illustrated, the wavelength conversion unit 190 can also be formed to cover the side of the light emitting structure 120 and can be formed to further cover the side of the insulating part 170.

The description of the wavelength conversion unit 190 is generally similar to that described with reference to FIG. 2 and therefore the detailed description thereof will be omitted.

Meanwhile, the light emitting device 100a can further include the growth substrate (not illustrated) which is disposed on the lower surface of the light emitting structure 120. When the light emitting device 100a includes the wavelength conversion unit 190, the growth substrate can be disposed between the light emitting structure 120 and the wavelength conversion unit 190.

The growth substrate is not limited as long as it is a substrate on which the light emitting structure 120 can be grown. For example, the growth substrate can be a sapphire substrate, a silicon carbide substrate, a silicon substrate, a gallium nitride substrate, an aluminum nitride substrate, or the like. The growth substrate can also be omitted. After the light emitting structure 120 is grown, the growth substrate can be separated and removed from the light emitting structure 120 by methods, such as laser lift off, chemical lift off, stress lift off, thermal lift off, and wrapping.

According to the exemplary embodiment of the disclosed technology, the light emitting device having the structure in which a current can be uniformly dispersed in a horizontal direction at the time of driving can adopt the first and second electrode including sintered metal particles. Therefore, even though the stress is applied to the first and second electrodes due to heat generated when the light emitting device is driven, the stress can be relieved thanks to the nonmetallic material included in sintered metal particles. Therefore, the reliability of the light emitting device can be improved.

FIG. 5 is a cross-sectional view for describing a light emitting apparatus according to another exemplary embodiment of the disclosed technology.

Referring to FIG. 5, the light emitting apparatus can include the light emitting device 100 according to the exemplary embodiments of the disclosed technology and a substrate 300. The light emitting device 100 can be mounted on the substrate 300.

The substrate 300 can be, for example, a PCB including a first conductivity pattern 311, a second conductive pattern 313, and an insulating layer 320 insulating them from each other, a submount substrate, or the like. In particular, the PCB can be a metal PCB in which the first and second conductive patterns 311 and 313 are made of metal. However, the disclosed technology is not limited thereto, and therefore the substrate 300 can be a substrate having various structures well known to those skilled in the art.

As such, the light emitting device 100 according to the exemplary embodiment of the disclosed technology can be used as a chip scale package which can be directly used without the separate packaging process.

FIG. 6 is a cross-sectional view for describing a light emitting apparatus according to another exemplary embodiment of the disclosed technology.

Referring to FIG. 6, the light emitting apparatus can include a plurality of light emitting devices 100 according to the exemplary embodiments of the disclosed technology and a substrate 400. The light emitting devices 100 can be mounted on the substrate 400.

FIG. 6 is a light emitting device module in which the plurality of light emitting devices 100 are mounted on one substrate 400. Therefore, the substrate 400 can be a form in which electrical wirings are provided, including a conductive pattern.

As such, the light emitting device 100 according to the exemplary embodiment of the disclosed technology can be directly applied to the light emitting device module as the chip scale package without the separate packaging process. Therefore, the process of fabricating a light emitting device module can be simplified.

FIGS. 7 to 19 are plan views and cross-sectional views for describing a method of fabricating a light emitting device according to other exemplary embodiments of the disclosed technology.

According to the exemplary embodiments of the disclosed technology, the light emitting device 100a illustrated in FIGS. 3(a), 3(b) and 4 can be provided. Therefore, the detailed description of the same components as those described in the exemplary embodiments of FIGS. 3(a), 3(b) and 4 will be omitted below and the disclosed technology is not limited to the description according to the exemplary embodiments of the disclosed technology. Further, in FIGS. 7 to 20, cross-sectional views (B) illustrate cross sections taken along the B-B of plan views (A).

First, Referring to FIG. 7, the light emitting structure 120 including the first conductivity type semiconductor layer 121, the active layer 123, and the second conductivity type semiconductor layer 125 is formed on the growth substrate 110.

The growth substrate 110 can be a growth substrate on which the light emitting structure 120 can be grown, and can include, for example, a sapphire substrate, a silicon carbide substrate, a silicon substrate, a nitride gallium substrate, a nitride aluminum substrate, or the like. According to the exemplary embodiment of the disclosed technology, the substrate 100 can be a patterned sapphire substrate (PSS).

The first conductivity type semiconductor layer 121, the active layer 123, and the second conductivity type semiconductor layer 125 can be formed by being sequentially grown. The light emitting structure 120 can include a nitride semiconductor and can be formed by methods of growing a nitride semiconductor layer such as MOCVD, HVPE, and MBE well known to those skilled in the art. Further, prior to growing the first conductivity type semiconductor layer 121, a buffer layer (not illustrated) can be further formed on the growth substrate 110.

The light emitting structure 120 can be grown on the growth substrate 110 to be provided in a wafer form. Therefore, the plurality of light emitting devices can also be provided by the method of fabricating a light emitting device according to the exemplary embodiments of the disclosed technology. However, the present embodiment illustrates and describes only a single light emitting device.

Next, referring to FIGS. 8(a) and 8(b), at least one hole 120h is formed by partially removing the second conductivity type semiconductor layer 125 and the active layer 123. As the hole 120h is formed, the first conductivity type semiconductor layer 121 can be partially exposed. Further, an isolation region 120i in which the light emitting structure 120 is isolated in a plurality of isolated device unit can be further formed on the growth substrate 110. Therefore, the light emitting structures 120 in the isolated device unit can be formed on the growth substrate 110.

At least one hole 120h can be formed by a photolithography process. In this case, a side of the hole 120h can be formed to be inclined by a photoresist reflow process. The number of holes 120h and the disposition form of the holes 120h are not limited, but as illustrated, the holes 120h can be uniformly disposed.

Meanwhile, as illustrated in FIG. 9, at least one hole 120h is formed but the formation of the isolation region 120i can also be omitted. In this case, the upper surface of the growth substrate 110 is not exposed and the light emitting structure 120 can be isolated while the wafer is isolated in a device unit in subsequent processes. However, a method of fabricating a light emitting device will be described below based on the case in which the isolation region 120i is first formed as illustrated in FIGS. 8(a) and 8(b).

Next, referring to FIGS. 10(a) and 10(b), the second contact electrode 140 is formed on the second conductivity type semiconductor layer 125. The second contact electrode 140 can be formed to generally cover the surface of the second conductivity type semiconductor layer 125 and can include an opening region in which the holes 120h are exposed.

When the second contact electrode 140 includes metal, the second contact electrode 140 can be formed by a plating and/or deposition method, etc., and can be patterned by the lift off process. Further, when the second electrode 140 includes the conductive oxide, the conductive oxide can be formed by the deposition method and then can be patterned by the process such as etching. By this, as illustrated, the second contact electrode 140 which is disposed on the upper surface of the second conductivity type semiconductor layer 125 and is integrally formed can be provided.

Referring to FIGS. 11(a) and 11(b), the first insulating layer 151 partially covering the light emitting structure 120 and the second contact electrode 140 is formed.

The first insulating layer 151 can be formed by depositing insulating materials such as $SiO_2$ and $SiN_x$ and can be patterned to include the first opening part 151a and the second opening part 151b by the lift off process or the etching process. The first opening part 151a can be formed to correspond to positions of the plurality of holes 120h. In particular, the first insulating layer 151 can cover the side of the plurality of holes 120h. The second opening part 151b can partially expose the second contact electrode 140 and the position of the second opening part 151b can be determined depending on the region in which the second electrode 163 is formed in subsequent processes. For example, as illustrated, the second opening part 151b can be disposed to be biased to one side of the light emitting structure 120 and can also be formed in plural.

Meanwhile, the first insulating layer 151 can further cover the surface of the growth substrate 110 exposed under the isolation region 120i. However, when the isolation region 120i is not formed, the first insulating layer 151 can be formed to cover only the light emitting structure 120.

Next, referring to FIGS. 12(a) and 12(b), the first contact electrode 130 which covers the first insulating layer 151 and ohmic-contacts the first conductivity type semiconductor layer 121 through the hole 120h is formed.

The first contact electrode 130 can be formed by the plating and deposition method, etc., and can be patterned by the lift off process, etc. The first contact electrode 130 contacts the first conductivity type semiconductor layer 121 through the hole 120h and therefore can be formed to cover the side and the lower surface of the first opening part 151a. In addition, the first contact electrode 130 can be insulated from the second contact electrode 140 by being spaced apart from the second contact electrode 140 by the first insulating layer 151. Therefore, the first contact electrode 130 can be formed to generally cover the light emitting structure 120 except for the region corresponding to the second opening part 151a.

Referring to FIGS. 13(a) and 13(b), the second insulating layer 153 partially covering the first contact electrode 130, the first insulating layer 151, and the second contact electrode 140 can be formed.

The second insulating layer 153 can be formed by depositing insulating materials such as $SiO_2$ and $SiN_x$ and can be patterned to include the third opening part 153a and the fourth opening part 153b by the lift off process or the etching process. The third opening part 153a can partially expose the first contact electrode 130 and can define a portion where the first electrode 161 is electrically connected to the first contact electrode 130. Similarly, the fourth opening part 153a can partially expose the second contact electrode 140 and can define a portion where the second electrode 163 is electrically connected to the second contact electrode 140. As illustrated, the third opening part 153a and the fourth opening part 153b can be formed to be biased to the sides opposite each other.

Next, referring to FIGS. 14a to 16, the first electrode 161, the second electrode 163, and the insulating part 170 can be formed on the light emitting structure 120 and the second insulating layer 153. This will be described below in detail.

Referring first to FIG. 14a, a pre first electrode 1611 and a pre second electrode 1631 can be formed on the third opening part 153a and the fourth opening part 153b, respectively.

The pre first electrode 1611 and the pre second electrode 1631 can include a viscous material including metal particles and a nonmetallic material interposed between the metal particles. In this case, the viscous material can be formed on the light emitting structure by dispensing, for example, a dotting method, thereby forming the pre first electrode 1611 and the pre second electrode 1631. The pre first electrode 1611 and the pre second electrode 1631 can each contact the first contact electrode 130 and the second contact electrode 140 through the third opening part 153a and the fourth opening part 153b.

The pre first electrode 1611 and the pre second electrode 1631 have viscosity and as illustrated, can be formed on the light emitting structure 120 in an arch shape. Further, the pre first electrode 1611 and the pre second electrode 1631 can have viscosity, and therefore can easily contact the first and second contact electrodes 130 and 140 through the third opening part 153a and the fourth opening part 153b.

The pre first electrode 1611 and the pre second electrode 1631 can be formed by the dispensing method, such that the region in which the electrode 160 is formed can be relatively accurately controlled and an interval between the first and second electrodes 161 and 163 can be reduced to about 300 µm.

Meanwhile, unlike this, as illustrated in FIG. 14b, the pre first electrode 1612 and the pre second electrode 1632 can also be formed by other methods.

Referring to FIG. 14b, the pre first electrode 1612 and the pre second electrode 1632 can also be formed on the light emitting structure 120 by application, for example, a screen printing method. In this case, the region in which the pre first electrode 1612 and the pre second electrode 1632 are formed is defined by a mask 410 and then an upper surface of the mask is applied with the viscous material, such that the pre electrodes 1612 and 1632 can be formed as illustrated in FIG. 13(b).

The pre first electrode 1612 and the pre second electrode 1632 can be formed by the applying method such as the screen printing method to shorten the formation time of the pre electrodes 1612 and 1632, thereby shortening the process time.

However, in the process to be described below, the case in which the pre electrodes 1611 and 1631 are formed by the dispensing method as illustrated in FIG. 14a will be described.

Next, referring to FIG. 15, the pre electrodes 1611 and 1631 can be heated and sintered. Therefore, a first electrode 161' and a second electrode 163' can be provided.

The pre electrodes 1611 and 1631 can be sintered at a low temperature of 300° C. or less and the metal particles can be modified to sintered metal particles form during the sintering process. In this case, some of the nonmetallic materials are interposed between the metal particles and thus can be included in sintered metal particles.

The volumes of the pre electrodes 1611 and 1631 can be reduced while the pre electrodes 1611 and 1631 are sintered into the electrode 160. Therefore, the first electrode 161' and the second electrode 163' can be formed in the form as illustrated in FIG. 15. In detail, the volumes of the pre electrodes 1611 and 1631 can little be reduced at the portion where the pre electrodes 1611 and 1631 contact the light emitting structure 120 and the second insulating layer 153 during the sintering process. On the other hand, the volumes of the pre electrodes 1611 and 1631 can be reduced at the portion where the pre electrodes 1611 and 1631 contact external air. Therefore, as illustrated in FIG. 15, sides of the first electrode 161' and the second electrode 163' can be bent. Therefore, the first electrode 161' and the second electrode 163' can each include inclined sides of which the tangential TL gradients with respect to sides of vertical cross sections thereof are changing. In particular, in terms of the characteristics of the sintering process, the tangential TL gradients with respect to the sides of the vertical cross sections of each of the first electrode 161' and the second electrode 163' can be increased from bottom toward top and then can again be decreased by passing through a certain point of inflection.

Meanwhile, the pre electrodes 1611 and 1631 can be sintered at a low temperature of 300° C. or less and therefore the light emitting structure 120, the insulating layers 151 and 153, and the contact electrodes 130 and 140 cannot be damaged by heat during the sintering process. In particular, when the contact electrodes 130 and 140 include Ag, sintering process can be performed at low temperature and therefore the reflectivity of Ag is not aggravated due to heat, thereby preventing the light emitting efficiency of the light emitting device from reducing.

Next, referring to FIG. 16, the insulating part 170 covering the first electrode 161', the second electrode 163', and the second insulating layer 153 is formed. Further, the first electrode 161 and the second electrode 163 can be formed so that the upper surfaces of the first electrode 161 and the second electrode 163 can be exposed by removing some of the insulating part 170 and the upper portions of the first electrode 161' and the second electrode 163'.

The insulating part 170 can be formed by applying and curing the insulating material such as EMC. Further, after the insulating part 170 is formed, the first and second electrodes 161 and 163 can be formed by partially removing the insulating part 170 and some of the upper portions of the first electrode 161' and the second electrode 163' along a predetermined line L-L using physical methods such as grinding. However, the disclosed technology is not limited thereto, and therefore the insulating part 170, the first electrode 161, and the second electrode 163' can be partially removed by using various methods known to those skilled in the art, for example, etching, a physico-chemical method, etc.

As such, according to the exemplary embodiment of the disclosed technology, the first and second electrodes 161 and 163 are formed by using the sintering method. The first and second electrodes 161 and 163 fabricated by the sintering method can have an arch form to improve the mechanical stability at the interface with the insulating part 170, thereby improving the reliability of the light emitting device. Further, at the time of fabricating the first and second electrodes 161 and 163 by the sintering method, the stress applied to the light emitting structure 120 is lower than the case in which the electrode is formed by the plating method or the deposition method, thereby preventing the light emitting structure 120 from being cracked or damaged. Further, the sintering method process can have a simpler process than the plating method or the method of using a solder and the electrodes contacting the contact electrodes can be formed without forming an additional component such as a seed layer and a wetting layer, thereby simplifying the process of fabricating a light emitting device.

Next, referring to FIG. 17, the first electrode pad 181 and the second electrode pad 183 can be formed on the insulating part 170 on which the first and second electrodes 161 and 163 are exposed.

The first electrode pad 181 and the second electrode pad 183 can each be formed to contact the first electrode 161 and the second electrode 163 and can be formed using the methods such as plating and deposition.

Referring to FIG. 18, the growth substrate 110 is separated from the light emitting structure 120.

The growth substrate 110 can be separated and/or removed from the light emitting structure 120 by the methods such as laser lift off, chemical lift off, stress lift off, thermal lift off, lapping, etc. Therefore, one surface of the light emitting structure 120, that is, the first conductivity type semiconductor layer 121 can be exposed. Further, the growth substrate 100 is removed, such that some of the lower surface of the first insulating layer 151 can be exposed.

After the growth substrate 100 is separated from the light emitting structure, a process of increasing surface roughness of the exposed surface of the first conductivity type semiconductor layer 121 can be further performed. Therefore, the surface of the first conductivity type semiconductor layer 121 can be provided with roughness including protrusions and/or depressions having a scale of μm to nm. The roughness can be formed by performing dry etch, wet etch, and/or electrochemical etch on the surface of the first conductivity type semiconductor layer 121. For example, the roughness can be formed by performing the wet etch on one surface of the light emitting structure 120 using a solution including at least one of KOH and NaOH or can be formed by PEC etch. Further, the roughness R can also be formed by a combination of the dry etch and the wet etch. Methods of forming the above roughness are only examples and therefore the roughness can be formed on the surface of the light emitting structure 120 using various methods known to those skilled in the art. Extraction efficiency of the light emitting device can be improved by forming the roughness on the surface of the light emitting structure 120.

Next, referring to FIG. 19, the wavelength conversion unit 190 can be formed on the light emitting structure 120 exposed by separating the growth substrate 110 therefrom. Therefore, the light emitting device as illustrated in FIG. 19 can be provided.

The wavelength conversion unit 190 can be provided by applying a carrier including a phosphor on the light emitting structure 120 and curing the applied carrier. Unlike this, the wavelength conversion unit 190 separately fabricated like a phosphor sheet can also be provided by being attached on the light emitting structure 120. Further, some of the wavelength conversion unit 190 can contact the first insulating layer 151.

Further, unlike that illustrated, the wavelength conversion unit 190 can also be formed to further cover the side of the light emitting structure 120 and can be formed to further cover the side of the insulating part 170.

In various embodiments, when the isolation region 120i is not formed before the first insulating layer 151 is formed, the light emitting device having the structure illustrated in FIGS. 20(*a*) and 20(*b*) can be provided.

Referring to FIG. 20(*a*), if the isolation region 120i is not formed before the first insulating layer 151 is formed, the lower surface of the first insulating layer 151 is not exposed even though the growth substrate 110 is separated. Therefore, the wavelength conversion unit 190 can be formed to cover only the lower surface of the first conductivity type semiconductor layer 121.

Further, as illustrated in FIG. 20(*b*), even though the isolation region 120i is not formed before the first insulating layer 151 is formed, the wavelength conversion unit 190 can also be formed to further cover the side of the first conductivity type semiconductor layer 121. In this case, a portion of the first insulating layer 151 can contact the wavelength conversion unit 190.

FIGS. 21 to 28 are cross-sectional views for describing a method of fabricating a light emitting device according to another exemplary embodiment of the disclosed technology. In the drawings of the present exemplary embodiments, the light emitting device of FIG. 24 can be provided according to the fabricating method of FIGS. 21 and 22 and the light emitting device of FIG. 25 can be provided according to the fabricating method of FIGS. 21 and 23. According to the present exemplary embodiment, a method of fabricating the plurality of first and second electrodes 161 and 163 formed on the wafer 100 will be described.

First, referring to FIGS. 21(a) to 21(c), at least one insulating part 170 can be formed on the wafer 100.

In detail, referring to FIG. 21(a), the mask 210 including at least one opening part 211 can be formed on the wafer 100.

The wafer 100 can include the growth substrate and the semiconductor layers formed by being grown on the growth substrate. In particular, the wafer 100 can include the light emitting structure including the first conductivity type semiconductor layer, the active layer, and the second conductivity type semiconductor layer and the light emitting structure can be disposed on the growth substrate. That is, the wafer 100 can include a structure in which the light emitting structure is formed on a large area growth substrate to fabricate the light emitting device. Therefore, the growth substrate is not limited as long as it is a substrate on which the light emitting structure can be grown. For example, the growth substrate can be a sapphire substrate, a silicon carbide substrate, a silicon substrate, a gallium nitride substrate, an aluminum nitride substrate, or the like.

The wafer 100 can include at least one device region DR and each device region DR can include the first contact electrode and the second contact electrode. In this case, the first contact electrode and the second contact electrode each can be electrically connected to the first conductivity type semiconductor layer and the second conductivity type semiconductor layer. Therefore, at least one light emitting device can be provided from the wafer 100 and when the wafer 100 includes the plurality of device regions DRs, the plurality of light emitting devices can be provided by a process of isolating the plurality of device regions into individual devices. This will be described below in detail.

The mask 210 can be grown on the growth substrate and can have at least one opening part 211. The upper surface of the wafer 100 can be partially exposed through the opening part 211.

The mask 210 can include any material which can define the opening part 211 to partially expose the wafer 100. For example, the mask 210 can include a photoresist. When the mask 210 includes the photoresist, the photoresist can be applied on the wafer 100 and then patterned to form the opening part 211, thereby forming the mask 210.

Meanwhile, the opening part 211 of the mask 210 can correspond to the region in which the insulating part 170 is formed in the process to be described below. Therefore, widths D1 and D2 of the opening part 211 can correspond to a width of the insulating part 170 and can be determined depending on the width of the insulating part 170 to be formed.

The opening part 211 can be formed to have at least two different widths. Some of the opening parts 211 can be disposed on one device region DR and the rest of the opening parts 211 can be formed over adjacent device regions DRs. In this case, the width of the opening part 211 disposed on one device region DR and the width of the opening part 211 formed over the adjacent device regions DRs can be different from each other.

For example, the width of the opening part 211 disposed on the one device region DR can be defined as D1 and the width of the opening part 211 disposed over the adjacent device regions DRs can be defined as D2. In this case, the D1 and the D2 can be different from each other, the D2 can be greater than the D1, further, a half value of the D2 can be greater than that of the D1. During the process of isolating the individual devices to be described below, the insulating part 170 formed in the region corresponding to the opening part 211 having the width of the D2 is separated along a device separation line L. In this case, for each individual device, the insulating part 170 having the width corresponding to the half value of the D2 can be formed along the outer side of the light emitting device.

Further, according to the exemplary embodiment of the disclosed technology, the width D1 of the opening part 211 disposed on the one device region DR can be equal to or less than 100 μm, in particular, range from about 10 to 80 μm.

Next, referring to FIG. 21(b), the insulating part 170 filing at least some of the opening part 211 of the mask 210 can be formed.

The insulating part 170 can include a material having electrical insulating property. For example, materials such as an epoxy molding compound (EMC) and Si resin can be applied on the wafer 100 to cover the mask 210 and can be then cured, thereby forming the insulating part 170. When the cured insulating part 170 is formed higher than a height of the mask 210 to completely cover the mask 210, the upper portion of the cured insulating part 170 can be partially removed to form the insulating part 170 as illustrated. However, the disclosed technology is not limited thereto, and therefore the insulating part 170 can also be formed by the deposition and patterning processes. In addition, the insulating part 170 can also include light-reflective and/or light scattering particles such as $TiO_2$ particles.

The insulating part 170 formed to fill at least some of the opening part 211 can have a width corresponding to the width of the opening part 211. Therefore, the insulating part 170 can have a width of about 10 to 80 μm. Further, the insulating part 170 can have a height corresponding to the height of the mask 210 and can have, for example, a thickness of about 50 to 80 μm or more.

Meanwhile, prior to forming the insulating part 170, the isolation process of isolating the light emitting structures of each device region DR of the wafer 100 in the device unit is performed. Although not illustrated, in this case, the light emitting structure on the growth substrate is isolated in the device unit, and thus grooves can be formed on the light emitting structure between each device regions DRs. The insulating part 170 can be formed to further fill the groove and the insulating part 170 can be formed to cover at least a portion of sides of the light emitting structure. Therefore, in the fabricated light emitting device, the insulating part 170 can also be formed to further cover the sides of the light emitting structure.

Next, referring to FIG. 21(c), the insulating parts 170 spaced apart from each other can be formed on the wafer 100 by removing the mask 210. Therefore, the upper surface of the wafer 100 is exposed between the insulating parts 170.

The mask 210 can be removed by various known methods such as an etch process. When the mask 210 includes the photoresist, the mask 210 can be removed by a chemical solution or the like to which the photoresist reacts.

Therefore, the wafer 100 having the insulating parts 170 spaced apart from each other thereon is provided.

Next, referring to FIGS. 22 and 23, the electrodes 160 or 260 can be formed on the wafer 100 and the wafer 100 can be isolated in an individual device unit. FIGS. 22(a) to 22(e) and 23(a) to 23(e) are sectional views for describing a method of fabricating a light emitting device according to different exemplary embodiments of the disclosed technology, the light emitting device of FIG. 24 can be provided according to the method of FIGS. 22(a) to 22(e), and the light emitting device of FIG. 25 can be provided according to the method of FIGS. 23(a) to 23(e).

First, a method of fabricating a light emitting device according to an exemplary embodiment of the disclosed technology will be described with reference to FIGS. 22(a) to 22(e) and 24.

Referring to FIG. 22(a), a pre electrode 160a can be formed on the wafer 100.

The pre electrode 160a can include the viscous material including the metal particles and the nonmetallic material interposed between the metal particles. In this case, the viscous material can be formed on the wafer 100 to cover the upper surface of the wafer 100 exposed between the insulating parts 170. Therefore, at least two pre electrodes 160a spaced apart from each other having the insulating part 170 therebetween can be formed.

The metal particles 160m included in the viscous material can include materials having thermal conductivity and electrical conductivity without any limitation. For example, the metal particles 160m can include at least one of Cu, Au, Ag, and Pt. In particular, according to the present exemplary embodiment, the metal particles can include Ag particles. The nonmetallic material can be a polymer material including, for example, C (carbon).

The viscous material can be applied on the wafer 100 using, for example, a dispenser 220. However, the disclosed technology is not limited thereto, the pre electrode 160a can be formed on the wafer 100 using the method such as screen printing. The upper surface of the pre electrode 160a can be formed to be substantially flush with the upper surface of the insulating part 170, such that the insulating part 170 can be at least partially exposed between the pre electrodes 160a.

Next, referring to FIG. 22(b), the electrode 160 is formed from the pre electrode 160a.

The electrode 160 can be formed by sintering the pre electrode 160a. For example, the electrode 160 can be formed by heating the pre electrode 160a at a temperature of about 300° C. or less. The metal particles of the pre electrode 160a can be modified into the sintered form during the sintering process. In this case, at least some of the nonmetallic material are interposed between the metal particles and thus can be included in the electrode 160. Within the electrode 160, the metal particles are sintered and thus can be formed in the form in which a plurality of grains are disposed and the nonmetallic material can be interposed in at least some region between the metal particles. The nonmetallic material can serve as a buffer relieving the stress which can be applied to the electrode 160. Therefore, the mechanical stability of the electrode 160 can be improved and thus the stress which can be applied from the electrode 160 to the wafer can be reduced.

The metal particles of the electrode 160 can be included at a ratio of 80 to 98 wt % compared with a total mass of the electrode 160. The electrode 160 can include the metal particles of the foregoing ratio to have the excellent heat conductivity and electrical conductivity, and effectively buffer the stress which can be applied to the electrode 160, thereby improving the mechanical stability of the electrode 160.

Meanwhile, the electrode 160 can have a volume smaller than that of the pre electrode 160a. The volume of the pre electrode 160a can be reduced by solidification and/or evaporation or the like of the nonmetallic material included in the pre electrode 160a during the sintering process, such that the volume of the electrode 160 can be smaller than that of the pre electrode 160a. Further, the pre electrode 160a and the wafer 100 are bonded to each other during the sintering process at the portion where the pre electrode 160a and the wafer 100 contact each other, such that the pre electrode 160a of the portion can keep the substantially original bonded state even during the sintering process. Therefore, the volume can be reduced at the portion of the pre electrode 160a which is disposed over the interface of the wafer 100 with the pre electrode 160a. As illustrated, a side 160s of the electrode 160 can be inclined. In particular, an angle formed by the side 160s of the electrode 160 and the wafer 100 can be less than 90°, for example can have an angle from 30° or more to less than 90°. In this case, the electrode 160 can include the side 160s of which the tangential gradient with respect to the side of the vertical cross section thereof is changing. Considering the characteristics of the sintering process, the electrode 160 can be provided in a form in which the tangential TL gradients with respect to the sides of the vertical cross sections of each of the electrodes can be increased from bottom toward top and then can again be decreased by passing through a certain point of inflection.

When the electrode 160 is formed by the sintering process, the volume of the electrode 160 is smaller than that of the pre electrode 160a, such that a gap region can be formed between the electrode 160 and the insulating part 170.

According to the present exemplary embodiment, the gap region between the insulating parts 170 having a predetermined width is filled with the pre electrode 160a and the electrode 160 is formed from the pre electrode 160a, such that the interval between the electrodes 160 can be freely determined depending on the width of the insulating part 170. Therefore, for the single light emitting device, the interval between the electrodes 160 can be easily formed at 100 μm or less, in particular, 10 to 80 μm. Therefore, the interval between the first electrode 161 and the second electrode 163 of the light emitting device 200a fabricated according to the present exemplary embodiment can be set to be 10 to 80 μm. Accordingly, increasing of a forward voltage ($V_f$) of the light emitting device 200a due to an increased interval between the electrodes can be prevented. Further, the horizontal cross sectional area of the electrode as much as the reduction in the interval between the electrodes can be increased, thereby improving the heat emission efficiency of the light emitting device 200a.

Next, referring to FIG. 22(c), the insulating part 170 filling between the gap region between the electrode 160 and the insulating part 170 can be further formed.

Therefore, the insulating part 170 can include a primary insulating part 171 primarily formed and a secondary insulating part 173 secondarily formed. The primary insulating part 171 and the secondary insulating part 173 can be made of the same material but can include different materials. The secondary insulating part 173 can include the epoxy molding compound (EMC), the Si resin, etc. The secondary insulating part 173 can be formed to cover the electrode 160 and the primary insulating part 171 using the application method, etc., and then can be formed by the method of exposing the upper surface of the electrode 160 by removing some of the upper portion thereof. However, the disclosed technology is not limited thereto.

The secondary insulating part 173 can be formed, and thus the upper surface of the wafer 100 and the insulating part 170 covering the side of the electrode 160 can be formed.

The electrode 160 can include the inclined side of which the tangential gradient with respect to the side of the vertical cross section thereof is changing, such that the mechanical stability at the interface of the insulating part 170 covering the side of the electrode 160 with the electrode 160 can be improved.

Next, referring to FIG. 22(*d*), the electrode pads 180 disposed on the electrodes 160 can be formed.

The electrode pads 180 can be disposed on each of the electrodes 160 and can be formed to be spaced apart from each other. The electrode pads 180 can be formed by depositing or plating materials including metals, for example, Ni, Pt, Pd, Rh, W, Ti, Al, Ag, Sn, Cu, Ag, Bi, In, Zn, Sb, Mg, Pb, etc. Further, each of the electrode pads 180 can be formed of a single layer structure or a multilayer structure.

The electrode pads 180 can be formed to have an area larger than that of the upper surfaces of each of the electrodes 160. Therefore, a portion of the electrode pads 180 can contact the insulating part 170. Further, the electrode pads 180 can be electrically connected to the electrodes 160.

The electrode pad 180 is formed, such that the light emitting device fabricated according to the present exemplary embodiment can be more stably mounted on a separate additional substrate, etc., when being applied to the module, etc. For example, when the electrode 160 includes a Cu or Ag particle sintered body, the electrode 160 has poor wettability for a solder, etc. The electrode pad 180 can be formed on the insulating part 170, such that the light emitting device can be stably mounted.

Next, referring to FIG. 22(*e*), the wafer 100 is isolated along the device isolation line L and therefore at least one light emitting device 200*a* as illustrated in FIG. 24 can be formed.

The device isolation line L can correspond to a portion between the device regions DRs of the wafer 100. Isolating the wafer 100 into a plurality of individual devices can include using physical methods such as etching, scribing, and breaking. Some of the insulating parts 170 are disposed on the device isolation line L and can be diced along with the wafer 100 while the wafer 100 is isolated.

According to the present exemplary embodiment, the width of the insulating part 170 formed over the adjacent device regions DRs can be freely determined. Therefore, the width of the insulating part 170 formed over the adjacent device regions DRs can be sufficiently large, thereby preventing the electrode 160 from being damaged due to a laser or a dicing tool during the individual device isolation.

That is, the widths of the insulating parts 170 formed between the electrodes 160 can be freely determined, such that the width D1 between the electrodes disposed on one device region DR can be relatively small and the width D2 between the electrodes disposed over the adjacent device regions DRs can be relatively large. Therefore, it is possible to improve the heat emission efficiency of the fabricated light emitting device, prevent the forward voltage from increasing, and effectively prevent the light emitting device from being damaged during the individual device isolation.

Meanwhile, according to the present exemplary embodiment, the method of fabricating a light emitting device can further include separating the growth substrate of the wafer 100 from the light emitting structure prior to isolating the wafer 100 in the individual device unit. The growth substrate 110 can be separated and removed from the light emitting structure 120 by the methods such as laser lift off, chemical lift off, stress lift off, thermal lift off, lapping. Further, an additional surface treatment process can be further performed on one surface of the light emitting structure in which the growth substrate is separated and exposed. By the surface treatment process, the roughness of the one surface of the light emitting structure can be increased and the light extraction efficiency of light emitted through the one surface of the light emitting structure having the increased roughness can be improved.

Further, according to the present exemplary embodiment, before and/or after the wafer 100 is isolated in the individual device unit, the wavelength conversion unit including a phosphor can be further formed on the lower surface of the wafer 100.

Referring to FIG. 24, a light emitting device 200*a* according to the present exemplary embodiment will be described in detail. The light emitting device 200*a* include the light emitting unit 100L and the electrode 160 and can further include the insulating part 170 and the first and second electrode pads 181 and 183. The light emitting device 200*a* of FIG. 24 can be substantially similar to the light emitting device 100 of FIG. 2 and the light emitting device 200*a* according to the present exemplary embodiment will be described below based on the difference.

The light emitting unit 100L can include the light emitting structure including the first conductivity type semiconductor layer, the second conductivity type semiconductor layer, and the active layer disposed between the first and second conductivity type semiconductor layers and can include the first contact electrode and the second contact electrode ohmic-contacting the first and second conductivity type semiconductor layers, respectively. According to the foregoing fabricating method, the light emitting unit 100L can be provided while being separated from the wafer 100.

The light emitting unit 100L and the light emitting structure can have various forms having the structure in which the first electrode 161 and the second electrode 163 can be disposed on one surface (upper surface of the light emitting unit in the drawing) of the light emitting unit 100L.

The electrode 160 can be disposed on the light emitting unit 100L and can also include the first electrode 161 and the second electrode 163. In this case, the first electrode 161 and the second electrode 163 each can be electrically connected to the first and second contact electrodes and the first and second electrodes 161 and 163 can directly contact the light emitting structure.

The first electrode 161 and the second electrode 163 can each include an inclined side. An angle θ formed by the sides of the electrodes 160 and the upper surface of the light emitting unit 100L can be less than 90°. For example, the angle θ can be 30°≤θ<90°.

Further, as illustrated, the first electrode 161 and the second electrode 163 can each include the inclined sides of which the tangential gradients with respect to the sides of vertical cross sections thereof are changing. Further, the tangential gradients with respect to the sides of the vertical cross sections of each of the first electrode 161 and the second electrode 163 can be increased from bottom toward top and then can again be decreased by passing through a certain point of inflection.

The first electrode 161 and the second electrode 163 can each include the inclined sides of which the tangential gradients with respect to the sides of the vertical cross sections thereof are changing, such that mechanical stability at the interface of the insulating part 170 with the first electrode 161 and the second electrode 163 can be improved. The first electrode 161 and the second electrode 163 can include the metal particles and can further include the nonmetallic material interposed between the metal particles. Further, the metal particles and the nonmetallic material can be formed in the sintered form.

A half value of a shortest distance of an interval 160D1 between the first electrode 161 and the second electrode 163 can be smaller than a shortest distance 160D2 from one side of one of the first and second electrodes 161 and 163 to the outer side of the insulating part 170. Further, the shortest distance of the interval 160D1 between the first electrode 161 and the second electrode 163 can be smaller than the shortest distance 160D2 from the one side of one of the first and second electrodes 161 and 163 to the outer side of the insulating part 170. That is, the electrodes 160 can be formed to be relatively biased to a central portion of the light emitting device 200a. In the light emitting unit 100L, the insulating layer, the contact electrode, etc., can be disposed on the side of the light emitting unit 100L, such that the light emitting region (active layer) can be disposed to be mainly biased to the central portion of the light emitting unit 100L. Most of the heat generated when the light emitting device 200a emits light can be generated from the light emitting region. According to the present exemplary embodiment, the electrode can be relatively biased to the central portion of the light emitting device 200a, such that the heat generated when the light emitting device 200a is driven can be more efficiently emitted through the electrode 160.

Further, the shortest distance of the interval 160D1 between the first electrode 161 and the second electrode 163 can be equal to or less than 100 μm, in particular, can range from 10 to 80 μm. According to the exemplary embodiment of the disclosed technology, the shortest distance of the interval 160D1 can be within the foregoing range. Accordingly, increasing of a forward voltage ($V_f$) of the light emitting device 200a due to an increased interval 160D1 between the electrodes 160 can be prevented. Further, the horizontal cross sectional area of the electrode as much as the reduction in the interval 160D1 between the electrodes can be increased, thereby improving the heat emission efficiency of the light emitting device 200a.

Further, the first electrode 161 and the second electrode 163 can have a thickness ranging from about 50 to 80 μm. The light emitting device according to the exemplary embodiment of the disclosed technology includes the electrode 160 having the thickness within the foregoing range, and as a result the light emitting device itself can be used as a chip scale package. The first electrode 161 and the second electrode 163 each can be formed to directly contact the first and second contact electrodes. By this configuration, separate additional components such as a seed layer required for the plating method and a wetting layer required for a solder can be omitted.

Meanwhile, the light emitting device 200a can further include the wavelength conversion unit (not illustrated) disposed on the lower surface of the light emitting unit 100L. The wavelength conversion unit can wavelength-convert the light emitted from the light emitting unit 100L, such that the light emitting device 200a emitting light having various wavelength bands can be implemented.

Next, a method of fabricating a light emitting device according to another exemplary embodiment of the disclosed technology will be described with reference to FIGS. 23(a) to 23(e) and 25. The method of fabricating a light emitting device according to the present exemplary embodiment is substantially similar to the exemplary embodiment described with reference to FIGS. 22(a) to 22(e) and 24, but can have a difference in the pre electrode 260a and the electrode 260. The present exemplary embodiment will be described below based on the difference and all of the technical features, configuration, and limitations described with reference to FIGS. 22(a) to 22(e) and 24 can be applied to the present exemplary embodiment. Further, the detailed description of the same configuration will be omitted.

Referring to FIG. 23(a), a pre electrode 260a can be formed on the wafer 100.

The pre electrode 260a can be formed to cover the upper surface of the wafer 100 exposed between the insulating parts 170 on the wafer 100, in particular, can be formed to completely cover the insulating parts 170. The pre electrode 260a can be formed by applying the viscous material including the metal particles and the nonmetallic material on the wafer 100. In this case, the pre electrode 260a can be applied on the wafer 100 at a thickness larger than the height of the insulating parts 170 so as to completely cover the insulating parts 170.

Next, referring to FIG. 23(b), the electrode 260 is formed from the pre electrode 260a.

The electrode 260 can be formed by sintering the pre electrode 260a. For example, the electrode 260 can be formed by heating the pre electrode 260a at a temperature of about 300° C. or less. The metal particles of the pre electrode 260a can be modified into the sintered form during the sintering process. While the electrode 260 is formed by the sintering, a volume of the pre electrode 260a can be reduced and thus the pre electrode 260a can be formed as the electrode Therefore, as illustrated, the electrode 260 can have a volume smaller than that of the pre electrode 260a. Further, according to the present exemplary embodiment, the pre electrode 260a can be sintered and thus even after the volume thereof is reduced, the electrode 260 can be formed in the state in which it covers the insulating parts 170. Therefore, a side 260s of the electrode 260 can be formed to be substantially perpendicular to the upper surface of the wafer 100.

The pre electrode 260a and the electrode 260 can have a difference in the fabricating method from the pre electrode 160a and the electrode 160 of FIGS. 22(a) to 22(e), but they can be substantially made of the same material.

Next, referring to FIG. 23(c), the insulating part 170 can be exposed by partially removing the electrode 260.

Some of the upper portion of the electrode 260 can be removed. For example, as illustrated, the upper surface of the insulating part 170 can be exposed by partially removing the electrode 260 which is disposed at the upper portion of a predetermined virtual line F-F. A portion of the electrode 260 can be removed by, for example, a lapping process.

Therefore, the plurality of electrodes 260 disposed in the region between the insulating parts 170 can be formed. Further, each of the formed electrodes 260 can be formed to contact the side of the insulating part 170 and the side of the electrode 260 can be formed to be substantially perpendicular to the upper surface of the wafer 100.

Referring to FIG. 23(d), the electrode pads 180 disposed on the electrodes 260 can be formed. Next, referring to FIG. 23(e), the wafer 100 can be isolated along the device isolation line L to form at least one light emitting device 200b as illustrated in FIG. 25.

According to the fabricating method according to the present exemplary embodiment, as illustrated in FIG. 25, the light emitting device 200b in which the sides 260s of the electrode 261 and 263 are formed to be substantially perpendicular to the upper surface of the light emitting unit 100L can be provided. The light emitting device 200b of FIG. 25 is substantially similar to the light emitting device 200a of FIG. 24 but can have a difference in the fact that the sides of the electrodes 261 and 263 are formed to be substantially vertical.

A half value of a shortest distance of an interval 260D1 between the first electrode 261 and the second electrode 263 can be smaller than a shortest distance 260D2 from one side of one of the first and second electrodes 261 and 263 to the outer side of the insulating part 170. Further, the shortest distance of the interval 260D1 between the first electrode 261 and the second electrode 263 can be smaller than the shortest distance 260D2 from the one side of one of the first and second electrodes 261 and 263 to the outer side of the insulating part 170. That is, the electrodes 260 can be formed to be relatively biased to a central portion of the light emitting device 200b. In the light emitting unit 100L, the insulating layer, the contact electrode, etc., can be disposed on the side of the light emitting unit 100L, such that the light emitting region (active layer) can be disposed to be mainly biased to the central portion of the light emitting unit 100L. Most of the heat generated when the light emitting device 200b emits light can be generated from most of the light emitting region. According to the present exemplary embodiment, the electrode 160 can be relatively biased to the central portion of the light emitting device 200b, such that the heat generated when the light emitting device 200b is driven can be more efficiently emitted through the electrode 160. Further, the interval 260D1 between the first electrode 261 and the second electrode 263 can be equal to or less than 100 µm, in particular, can range from 10 to 80 µm.

According to the present exemplary embodiment, the side 260s of the electrode 260 can be formed to be substantially perpendicular to the light emitting unit 100L, such that the heat emission efficiency by the electrode 260 can be more improved.

FIGS. 26 to 30 are cross-sectional views for describing a method of fabricating a light emitting device according to another exemplary embodiment of the disclosed technology. In the drawings of the present exemplary embodiments, the light emitting device of FIG. 29 can be provided according to the fabricating method of FIGS. 26 and 27(a) to 27(f) and the light emitting device of FIG. 30 can be provided according to the fabricating method of FIGS. 26 and 28(a) to 28(h). Further, according to the present exemplary embodiment, the detailed description of the substantially same components as those described with reference to the exemplary embodiment of FIGS. 21 to 25 will be omitted. The same reference numerals are applied to the same components.

First, referring to FIG. 26, the mask 210 including at least two opening parts 211 can be formed on the wafer 100.

The photoresist can be applied on the wafer and then patterned to form the opening 213, thereby providing the mask 210. In this case, the at least adjacent two opening parts 213 can be disposed on one device region DR.

Masking regions of the mask 210 can be formed to have at least two different widths. Some of the masking regions can be disposed on one device region DR and the rest of the masking regions can be formed over the adjacent device regions DRs. In this case, a width D1' of the masking region disposed on the one device region DR can be different from a width of a masking region D2' formed over the adjacent device regions DRs.

For example, the width of the masking region disposed on the one device region DR can be defined as D1' and the width of the masking region disposed over the adjacent device regions DRs can be defined as D2'. In this case, the D1' and the D2' can be different from each other, the D2' can be larger than the Dr, and a half value of the D2' can be larger than that of the Dr. During the process of isolating the individual devices to be described below, the insulating part 170 formed in the region corresponding to the masking region having the width of the D2' is separated along the device separation line L. In this case, for each individual device, the insulating part 170 having the width corresponding to the half value of the D2' can be formed along the outer side of the light emitting device.

Further, the width D1' of the masking region of the mask 210 disposed on the one device region DR can be equal to or less than 100 µm, in particular, range from about 10 to 80 µm.

The interval between the electrodes 160 during the subsequent process can be determined depending on the width of the masking region of the mask 210.

Next, referring to FIGS. 27(a) to 27(f) and 28(a) to 28(h), the electrodes 160 or 260 and the insulating parts 170 can be formed on the wafer 100 and the wafer 100 can be isolated in the individual device unit. FIGS. 27(a) to 27(f) and 28(a) to 28(h) are sectional views for describing a method of fabricating a light emitting device according to different exemplary embodiments of the disclosed technology, the light emitting device of FIG. 29 can be provided according to the method of FIGS. 27(a) to 27(f), and the light emitting device of FIG. 30 can be provided according to the method of FIGS. 28(a) to 28(h).

First, a method of fabricating a light emitting device according to another exemplary embodiment of the disclosed technology will be described with reference to FIGS. 27(a) to 27(f) and 29.

Referring to FIG. 27(a), the pre electrode 160a can be formed on the wafer 100.

The pre electrode 160a can be formed by covering the upper surface of the wafer 100 exposed between the insulating parts 170 on the wafer 100 with the viscous material including the metal particles and the nonmetallic material interposed between the metal particles. Therefore, at least two pre electrodes 160a spaced apart from each other having the insulating part 170 therebetween can be formed. The upper surface of the pre electrode 160a can be formed to be substantially flush with the upper surface of the insulating part 170, such that the insulating part 170 can be at least partially exposed between the pre electrodes 160a.

Next, referring to FIG. 27(b), the electrode 160 is formed from the pre electrode 160a.

The electrode 160 can be formed by sintering the pre electrode 160a. For example, the electrode 160 can be formed by heating the pre electrode 160a at a temperature of about 300° C. or less. Therefore, the plurality of electrodes 160 filling the opening parts 213 of the mask 210 can be formed.

In the sintered process, the metal particles of the pre electrode 160a can be modified into the sintered form and the nonmetallic material can be interposed between the metal particles. Therefore, the electrode 160 can include the metal particles and the nonmetallic material interposed between the metal particles. The metal particles of the electrode 160 can be included at a ratio of 80 to 98 wt % compared with a total mass of the electrode 160.

Further, the volume of the pre electrode 160a can be reduced by the solidification and/or evaporation or the like of the nonmetallic material included in the pre electrode 160*a* during the sintering process, such that the volume of the electrode 160 can be smaller than that of the pre electrode 160*a*. However, the pre electrode 160*a* and the wafer 100 are bonded to each other at the portion where the pre electrode 160*a* and the wafer 100 contact each other, such that the pre electrode 160*a* of the portion can keep the substantially original bonded state even during the sintering process. Therefore, the volume can be reduced at the portion of the pre electrode 160*a* which is disposed over the interface of the wafer 100 with the pre electrode 160*a*. As illustrated, a side 160*s* of the electrode 160 can be inclined. In particular, the angle formed by the side 160*s* of the electrode 160 and the wafer 100 can have 90° or less. In this case, the electrode 160 can include the side 160*s* of which the tangential gradient with respect to the side of the vertical cross section thereof is changing. Considering the characteristics of the sintering process, the tangential TL gradients can be provided in a form in which the tangential TL gradients with respect to the sides of the vertical cross sections of each of the electrodes can be increased from bottom toward top and then can again be decreased by passing through a certain point of inflection.

Next, referring to FIG. 27(*c*), the electrodes 160 spaced apart from each other can be formed on the wafer 100 by removing the mask 210. Therefore, the upper surface of the wafer 100 is exposed between the electrodes 160.

The mask 210 can be removed by various known methods such as an etch process. When the mask 210 includes the photoresist, the mask 210 can be removed by a chemical solution or the like to which the photoresist reacts.

Although the present exemplary embodiment describes that the electrode 160 is formed and the mask 210 is removed, the disclosed technology is not limited thereto, but the sequence thereof can be altered.

Next, referring to FIG. 27(*d*), the spaced region between the electrodes 160 can be provide with the insulating part 170.

The materials such as an epoxy molding compound (EMC) having electrical insulating property and Si resin can be applied on the wafer 100 to cover the electrodes 160 on the wafer 100 and can be then cured, thereby forming the insulating part 170. The insulating part 170 can be formed to fill the region between the electrodes and the sides of the electrodes can contact the insulating part 170. Therefore, the electrodes 160 can be insulated from each other. In addition, the insulating part 170 can also include light-reflective and/or light scattering particles such as $TiO_2$ particles.

Referring to FIG. 27(*e*), the electrode pads 180 disposed on the electrodes 160 can be formed. Next, referring to FIG. 27(*f*), the wafer 100 can be isolated along the device isolation line L to form at least one light emitting device 200*a* as illustrated in FIG. 29.

The light emitting device 200*a* is substantially the same as the light emitting device of FIG. 24 and therefore the detailed description thereof will be omitted.

According to the present exemplary embodiment, unlike the exemplary embodiments of FIGS. 21(*a*) to 21(*c*) and 22(*a*) to 22(*e*), the electrode 160 can be formed earlier than the insulating part 170. According to the present exemplary embodiment, the insulating part 170 can be formed after the electrode 160 is formed, and therefore the volume of the pre electrode 160*a* is reduced while the electrode 160 is formed, such that the secondary insulating part 173 for filling the gap region between the electrode 160 and the insulating part 170 need not be formed separately. Therefore, the process of fabricating a light emitting device can be simplified.

First, a method of fabricating a light emitting device according to another exemplary embodiment of the disclosed technology will be described with reference to FIGS. 28(*a*) to 28(*h*) and 30. The method of fabricating a light emitting device according to the present exemplary embodiment is substantially similar to the exemplary embodiment described with reference to FIGS. 27(*a*) to 27(*f*) and 29, but can have a difference in the pre electrode 260*a* and the electrode 260. The present exemplary embodiment will be described below based on the difference and all of the technical features, configuration, and limitations described with reference to FIGS. 27(*a*) to 27(*f*) and 29 can be applied to the present exemplary embodiment. Further, the detailed description of the same configuration will be omitted.

Referring to FIG. 28(*a*), the pre electrode 260*a* can be formed on the wafer 100.

The pre electrode 260*a* can be formed on the wafer 100 to cover the upper surface of the wafer 100 exposed through the opening part 213, in particular, can be formed to completely cover the mask 210. The pre electrode 260*a* can be formed by applying the viscous material including the metal particles and the nonmetallic material on the wafer 100. In this case, the pre electrode 260*a* can be applied on the wafer 100 at a thickness larger than the height of the mask 210 so as to completely cover the mask 210.

Next, referring to FIG. 28(*b*), the electrode 260 is formed from the pre electrode 260*a*.

The electrode 260 can be formed by sintering the pre electrode 260*a*. For example, the electrode 260 can be formed by heating the pre electrode 260*a* at a temperature of about 300° C. or less. The metal particles of the pre electrode 260*a* can be modified into the sintered form during the sintering process. While the electrode 260 is formed by the sintering, a volume of the pre electrode 260*a* can be reduced and thus the pre electrode 260*a* can be formed as the electrode Therefore, as illustrated, the electrode 260 can have a volume smaller than that of the pre electrode 260*a*. Further, according to the present exemplary embodiment, the pre electrode 260*a* can be sintered and thus even after the volume thereof is reduced, the electrode 260 can be formed in the state in which it covers the mask 210. Therefore, a side 260*s* of the electrode 260 can be formed to be substantially perpendicular to the upper surface of the wafer 100.

The pre electrode 260*a* and the electrode 260 can have a difference in the fabricating method from the pre electrode 160*a* and the electrode 160 of FIGS. 27(*a*) to 27(*f*), but they can be substantially made of the same material.

Next, referring to FIGS. 28(*c*) and 28(*d*), the mask 210 can be exposed by partially removing the electrode 260.

Some of the upper portion of the electrode 260 can be removed. For example, as illustrated, the upper surface of the mask 210 can be exposed by partially removing the electrode 260 which is disposed at the upper portion of a predetermined virtual line F-F. A portion of the electrode 260 can be removed by, for example, a lapping process.

Therefore, the plurality of electrodes 260 disposed in the region between the insulating parts 170 can be formed. Further, each of the formed electrodes 260 can be formed to contact the side of the insulating part 170 and the side 260*s* of the electrode 260 can be formed to be substantially perpendicular to the upper surface of the wafer 100.

Referring to FIG. 28(*e*), the upper surface of the wafer 100 can be partially exposed by removing the mask 210 between the electrodes 260. Therefore, the plurality of electrodes 260 spaced apart from each other can be formed.

The mask 210 can be removed by various known methods such as an etch process. When the mask 210 includes the photoresist, the mask 210 can be removed by a chemical solution or the like to which the photoresist reacts.

Next, referring to FIG. 28(*f*), the spaced region between the electrodes 260 can be provide with the insulating part 170.

The materials such as an epoxy molding compound (EMC) having electrical insulating property and Si resin can be applied on the wafer 100 to cover the electrodes 260 on the wafer 100 and can be then cured, thereby forming the insulating part 170. The insulating part 170 can be formed to fill the region between the electrodes and the sides 260*s* of the electrodes 260 can contact the insulating part 170. Therefore, the electrodes 160 can be insulated from each other. In addition, the insulating part 170 can also include light-reflective and light scattering particles such as $TiO_2$ particles.

Referring to FIG. 28(*g*), the electrode pads 180 disposed on the electrodes 260 can be formed. Next, referring to FIG. 27(*h*), the wafer 100 can be isolated along the device isolation line L to form at least one light emitting device 200*b* as illustrated in FIG. 30.

The light emitting device 200*b* is substantially the same as the light emitting device of FIG. 25 and therefore the detailed description thereof will be omitted.

According to the exemplary embodiment of FIGS. 26 to 30, the electrode 160 or 260 is formed prior to forming the insulating part 170. Therefore, the interval between the electrodes 160 or 260 can be adjusted depending on the width of the masking region of the mask 210.

In detail, according to the present exemplary embodiment, the width of the insulating part 170 formed over the adjacent device regions DRs can be freely determined depending on the width of the masking region of the mask 210. Therefore, the width of the insulating part 170 formed over the adjacent device regions DRs can be sufficiently large, thereby preventing the electrode 160 from being damaged due to a laser or a dicing tool during the individual device isolation.

That is, the widths of the insulating parts 170 formed between the electrodes 160 can be freely determined while the mask 210 is formed, such that the width D1' between the electrodes 160 disposed on one device region DR can be relatively small and the width D2' between the electrodes 160 disposed over the adjacent device regions DRs can be relatively large. Therefore, it is possible to improve the heat emission efficiency of the fabricated light emitting device, prevent the forward voltage from increasing, and effectively prevent the light emitting device from being damaged during the individual device isolation.

FIGS. 31 and 32 are cross-sectional views for describing a light emitting device according to another exemplary embodiment of the disclosed technology.

FIGS. 31 and 32 relate to a light emitting device having a general flip chip type structure, which will be described below in detail. However, the same components as those described with reference to FIGS. 21 to 30 are denoted by the same reference numerals, and therefore the detailed description thereof will be omitted. Further, according to the exemplary embodiment of the FIGS. 21 to 30, the technical features, configurations, and limitations additionally described can be applied to the present exemplary embodiments.

Referring first to FIG. 31, a light emitting device 200*c* can include the light emitting structure 120, the electrode 160, the contact electrodes 130 and 140, and the insulating part 170 and can further include the first and second electrode pads 181 and 183, the insulating layer 150, and the wavelength conversion unit 190.

The light emitting structure 120 can include the first conductivity type semiconductor layer 121, the active layer 121 disposed on the first conductivity type semiconductor layer 123, and the second conductivity type semiconductor layer 125 disposed on the active layer 123. In addition, the light emitting structure 120 can include a region in which the first conductivity type semiconductor layer 121 is partially exposed by partially removing the second conductivity type semiconductor layer 125 and the active layer 123.

The contact electrodes 130 and 140 can include the first contact electrode 130 and the second contact electrode 140. The first contact electrode 130 and the second contact electrode 140 can each contact the first and second conductivity type semiconductor layers 121 and 125 by being disposed on the first and second conductivity type semiconductor layers 121 and 125 and can ohmic-contact each of them.

The first contact electrode 130 and the second contact electrode 140 can include nitride based semiconductor and any material forming the ohmic contact. For example, the first contact electrode 130 and the second contact electrode 140 can include metal, conductive oxide, conductive nitride, etc.

The insulating layer 150 can partially cover the light emitting structure 120 and the contact electrodes 130 and 140. The insulating layer 150 can cover the upper surface of the light emitting structure 120, a side of a mesa including the second conductivity type semiconductor layer 125 and the active layer 123, and a portion of the contact electrodes 130 and 140. The insulating layer 150 can serve to more effectively insulate the first contact electrode from the second electrode 140 and can also serve to protect the light emitting structure from the external environment.

The electrode 160 can be disposed on the light emitting structure 120 and can also include the first electrode 161 and the second electrode 163. In this case, the first electrode 161 and the second electrode 163 can each be electrically connected to the first contact electrode 130 and the second contact electrode 140 by being disposed on the first contact electrode 130 and the second contact electrode 140. Therefore, the first and second electrodes 161 and 163 each can be electrically connected to the first and second conductivity type semiconductor layers 121 and 125.

Further, the first and second electrodes 161 and 163 can directly contact the contact electrodes 130 and 140.

The first electrode 161 and the second electrode 163 can each include an inclined side. The first electrode 161 and the second electrode 163 can each include the inclined sides of which the tangential gradients with respect to the sides of vertical cross sections thereof are changing. Further, the inclined sides of each of the first electrode 161 and the second electrode 163 can include a region in which the tangential gradient is increased and a region in which the tangential gradient is reduced.

The first electrode 161 and the second electrode 163 can each include the inclined sides of which the tangential gradients with respect to the sides of the vertical cross sections thereof are changing, such that mechanical stability at the interface of the insulating part 170 with the first electrode 161 and the second electrode 163 can be improved.

Unlike this, the sides of each of the first electrode 161 and the second electrode 163 can be formed to be substantially perpendicular to the upper surface of the light emitting structure 120. In this case, the heat emission efficiency by the first and second electrodes 161 and 163 can be improved.

Meanwhile, the interval of the shortest distance between the first electrode 161 and the second electrode 163 can be equal to or less than 100 µm, in particular, can range from about 10 to 80 µm. In detail, according to the present exemplary embodiment, the shortest distance from the portion where the first electrode 161 contacts the insulating part 150 to the portion where the second electrode 163 contacts the insulating part 150 can range from about 10 to 80 µm. The shortest distance of the interval between the first electrode 161 and the second electrode 163 can be provided within the foregoing range to prevent the forward voltage Vf from increasing. Further, the horizontal cross sectional areas of the electrodes 161 and 163 can be large, such that the heat emission efficiency of the light emitting device 200c can be improved. Further, the first electrode 161 and the second electrode 163 can include the metal particles and the non-metallic material interposed between the metal particles. Further, the first and second electrodes 161 and 163 can each include the metal particles. The metal particles can be included at a ratio of 80 to 98 wt % compared with the masses of each of the first and second electrodes 161 and 163.

Further, the first electrode 161 and the second electrode 163 can have a thickness ranging from about 50 to 80 µm. The light emitting device according to the exemplary embodiment of the disclosed technology includes the electrode 160 having the thickness within the foregoing range, and as a result the light emitting device itself can be used as a chip scale package.

The insulating part 170 can be formed on the light emitting structure to cover the side of the electrode 160. The first electrode 161 and the second electrode 163 can be exposed on the upper surface of the insulating part 170.

The insulating part 170 can have an electrical insulating property and cover the sides of the first and second electrodes 161 and 163 to effectively insulate the first and second electrode 161 and 163 from each other. At the same time, the insulating part 170 can serve to support the first and second electrodes 161 and 163. The lower surface of the insulating part 170 can be formed to be parallel with the lower surfaces of the first electrode 161 and the second electrode 163 at substantially the same height.

The first electrode pad 181 and the second electrode pad 183 can be disposed on one surface of the insulating part 170. In particular, as illustrated, the first electrode pad 181 and the second electrode pad 183 can be disposed on the lower surface of the insulating part 170 on which the first and second electrodes 161 and 163 are exposed, among the one surfaces of the insulating part 170.

The wavelength conversion unit 190 can be disposed on the lower surface of the light emitting structure 120. The wavelength conversion unit 190 can convert a wavelength of the light emitted from the light emitting structure 120 to let the light emitting device to emit light having a desired wavelength band.

The light emitting device 200c can further include the growth substrate (not illustrated). In this case, the growth substrate can be interposed between the light emitting structure 120 and the wavelength conversion unit 190. Further, the insulating part 170 can also formed to further cover the side of the light emitting structure 120. In this case, the wavelength conversion unit 190 can also contact the insulating part 170.

Meanwhile, the lower surface of the light emitting structure 120, that is, the lower surface of the first conductivity type semiconductor layer 121 is separated from the growth substrate, and then the roughness thereof can be increased and thus can include the roughness. Therefore, a light emitting device 200d as illustrated in FIG. 32 can be provided. FIG. 32 does not illustrate the wavelength conversion unit 190, but the light emitting device 200d can also further include the wavelength conversion unit 190.

The roughness can be formed by performing dry etch, wet etch, and/or electrochemical etch on the surface of the of the first conductivity type semiconductor layer 121. For example, the roughness can be formed by performing the wet etch on one surface of the light emitting structure 120 using a solution including at least one of KOH and NaOH or can be formed by PEC etch. Further, the roughness can also be formed by a combination of the dry etch and the wet etch. Therefore, the surface of the first conductivity type semiconductor layer 121 can be provided with roughness including protrusions and/or depressions having a scale of µm to nm. Methods of forming the above roughness are only examples and therefore the roughness can be formed on the surface of the light emitting structure 120 using various methods known to those skilled in the art. The extraction efficiency of the light emitting device can be improved by forming the roughness on the surface of the light emitting structure 120.

FIGS. 33(*a*) and 33(*b*) and 34 are plan views and a cross-sectional view for describing a light emitting device according to still another exemplary embodiment of the disclosed technology. A light emitting device 200e of FIGS. 33(*a*) and 33(*b*) and 34 can be substantially similar to the light emitting device 100a of FIGS. 3(*a*) and 3(*b*) and 4. However, the light emitting device 200e can have a difference in the number of holes 120h and the disposition of the holes 120h and therefore the spaced distance of the electrodes 161 and 163 will be described in more detail. However, the components described in the foregoing exemplary embodiments and the same components are denoted by the same reference numerals and therefore the detailed description thereof will be omitted. Further, the technical features, configurations, and limitations additionally described in the foregoing exemplary embodiment can be applied to the present exemplary embodiments.

FIG. 33(*a*) is a plan view of the light emitting device, FIG. 33(*b*) is a plan view for describing positions of the holes 120h and positions of third and fourth opening parts 153a and 153b, and FIG. 34 is a cross-sectional view illustrating a cross section of a region corresponding to the line A-A of FIGS. 33(*a*) and 33(*b*).

Referring to FIGS. 33(*a*) and 33(*b*) and 34, the light emitting device 200e can include the light emitting structure 120 including the first conductivity type semiconductor layer 121, the active layer 123, and the second conductivity type semiconductor layer 125, the first contact electrode 130, the second contact electrode 140, the first insulating layer 151, the second insulating layer 153, the first electrode 161, and the second electrode 163. Further, the light emitting device 200e can further include the insulating part 170, the first and second electrode pads 181 and 183, the growth substrate (not illustrated), and the wavelength conversion unit (not illustrated).

The light emitting structure 120 can include the first conductivity type semiconductor layer 121, the active layer 121 disposed on the first conductivity type semiconductor layer 123, and the second conductivity type semiconductor layer 123 disposed on the active layer. In addition, the light emitting structure 120 can include a region in which the first conductivity type semiconductor layer 123 is partially exposed by partially removing the second conductivity type semiconductor layer 125 and the active layer 121. For example, as illustrated, the light emitting structure 120 can include at least one hole 120h penetrating through the second conductivity type semiconductor layer 125 and the active layer 123 to expose the first conductivity type semiconductor layer 121. The light emitting structure 120 can further include a roughness 120R formed on the lower surface thereof. The roughness 120R can include protrusions and/or depressions formed on a surface of the first conductivity type semiconductor layer 121 and having a scale of μm to nm. The extraction efficiency of the light emitting device can be improved by forming the roughness on the surface of the light emitting structure 120.

A half value of a shortest distance of an interval 160D1 between the first electrode 161 and the second electrode 163 can be smaller than a shortest distance 160D2 from one side of one of the first and second electrodes 161 and 163 to the outer side of the insulating part 170. Further, the shortest distance of the interval 160D1 between the first electrode 161 and the second electrode 163 can be smaller than the shortest distance 160D2 from the one side of one of the first and second electrodes 161 and 163 to the outer side of the insulating part 170. That is, the electrodes 160 can be formed to be relatively biased to a central portion of the light emitting device 200e. In the light emitting device 200e according to the exemplary embodiment of the disclosed technology, the insulating layers 151 and 153, the contact electrodes 130 and 140, or the like can be disposed on the side of the light emitting structure 120, such that the active layer 123 can be mainly disposed to be biased to the central portion of the light emitting structure 120. The electrode 160 can be relatively biased to the central portion of the light emitting device 200b, such that the heat generated from the active layer 123 when the light emitting device 200e is driven can be more efficiently emitted through the electrode 160.

The description of the first electrode 161 and the second electrode 163 is substantially similar to one described with reference to FIGS. 21 to 32 and therefore the detailed description thereof will be omitted. In particular, the shortest distance of the interval 160D1 of the first and second electrodes 161 and 163 can range from 10 to 80 μm.

The wavelength conversion unit (not illustrated) can be disposed on the lower surface of the light emitting structure 120. Some of the wavelength conversion unit can also contact the first insulating layer 151. Further, the wavelength conversion unit can also be formed to cover the side of the light emitting structure 120 and can be formed to further cover the side of the insulating part 170.

The description of the wavelength conversion unit 190 is generally similar to that described with reference to FIG. 31 and therefore the detailed description thereof will be omitted.

Meanwhile, the light emitting device 200e can further include the growth substrate (not illustrated) which is disposed on the lower surface of the light emitting structure 120. When the light emitting device 200e includes the wavelength conversion unit, the growth substrate can be disposed between the light emitting structure 120 and the wavelength conversion unit.

According to the exemplary embodiment of the disclosed technology, the light emitting device having the structure in which a current can be uniformly dispersed in a horizontal direction at the time of driving can adopt the first and second electrode including the sintered metal particle. Therefore, even though the stress is applied to the first and second electrodes due to heat generated when the light emitting device is driven, the stress can be relieved thanks to the nonmetallic material included in the electrode. Therefore, the reliability of the light emitting device can be improved.

Further, the shortest distance 160D1 of the interval of the first and second electrodes 161 and 163 can range from 10 to 80 μm, thereby implementing the low forward voltage and effectively emitting the heat generated at the time of the driving.

FIGS. 35 and 36 are cross-sectional views for describing a light emitting apparatus according to another exemplary embodiment of the disclosed technology.

Referring to FIG. 35, the light emitting apparatus can include the light emitting device according to the exemplary embodiments of the disclosed technology and the substrate 300. As the light emitting device, the light emitting devices described with reference to FIGS. 21 to 34 can be applied and mounted on the substrate 300.

The light emitting device 200a can include the first and second electrode pads 181 and 183 and the first and second electrode pads 181 and 183 can each be bonded to first and second conductive patterns 311 and 313, such that the light emitting device 200a can be mounted on the substrate 300. The first and second electrode pads 181 and 183 can be each formed on the first and second conductive patterns 311 and 313 by the solder or the conductive adhesive. As such, the light emitting device according to the exemplary embodiment of the disclosed technology can be used as the chip scale package which can be directly used without the separate packaging process.

Meanwhile, the light emitting device according to the exemplary embodiment of the disclosed technology can be mounted on the substrate 300 without including the first and second electrode pads 181 and 183. Referring to FIG. 36, the light emitting device 200a does not include the first and second electrode pads 181 and 183 and can be bonded to the substrate 300 by bonding layers 231 and 233.

The bonding layers 231 and 233 can include metallic materials such as metal. For example, the light emitting device 200a can be bonded to the substrate 300 by eutectic bonding. For example, when the first and second conductive patterns 311 and 313 include Au, the light emitting device 200a can be effectively bonded on the substrate 300 by the bonding layers 231 and 233 including an Au/Sn alloy having the eutectic structure. However, the disclosed technology is not limited thereto.

Although various exemplary embodiments of the disclosed technology have been described hereinabove, the disclosed technology is not limited to the respective exemplary embodiments and features described above. Modifications through combination and substitution of technical features described in the exemplary embodiments are included in the scope of the disclosed technology, and various modifications and alterations can be made without departing from the spirit of the disclosed technology as defined in the claims.

The invention claimed is:
1. A light emitting device, comprising:
a light emitting structure including a first conductivity type semiconductor layer, a second conductivity type semiconductor layer, and an active layer disposed between the first conductivity type semiconductor layer and the second conductivity type semiconductor layer, the light emitting structure disposed between a first surface and a second surface opposite to the first surface;
first and second contact electrodes disposed on the first surface of the light emitting structure to be in ohmic-contact with the first and second conductivity type semiconductor layers, respectively;

a first electrode disposed on the first surface of the light emitting structure and electrically connected to the first contact electrode;

a second electrode disposed on the first surface of the light emitting structure and electrically connected to the second contact electrode; and an insulating part covering sides of the first and second electrodes and the first surface of the light emitting structure, wherein the first and second electrodes, each including metal particles, and the first and second electrodes, each including an inclined side having tangential gradients with respect to a vertical line orthogonal to a surface of the first electrode or the second electrode, the tangential gradients changing along a surface of the inclined side.

2. The light emitting device of claim 1, wherein the inclined side includes a region in which the tangential gradient is increased and a region in which the tangential gradient is reduced.

3. The light emitting device of claim 1, wherein each of the first and second electrodes has a horizontal cross sectional area that is gradually reduced toward a direction far away from the first surface of the light emitting structure.

4. The light emitting device of claim 1, wherein the first and second electrodes have surfaces not covered by the insulating part.

5. The light emitting device of claim 4, further comprising:

a first electrode pad and a second electrode pad disposed on the surfaces of the first and second electrodes, respectively.

6. The light emitting device of claim 5, wherein the first electrode pad and the second electrode pad extend beyond areas of the first and second electrodes, respectively.

7. The light emitting device of claim 1, further comprising:

a wavelength conversion unit disposed on the second surface of the light emitting structure.

8. The light emitting device of claim 1, wherein the first and second electrodes include sintered metal particles, and the sintered metal particles include the metal particles and a nonmetallic material interposed between the metal particles.

9. The light emitting device of claim 8, wherein the metal particles include Ag.

10. The light emitting device of claim 8, wherein the range of the metal particles included in the sintered metal particles is from 80 to 98 wt %.

11. The light emitting device of claim 1, further comprising:

an exposed region in which the first conductivity type semiconductor layer is partially exposed and the active layer and the second conductivity type semiconductor layer are removed;

a first insulating layer insulating the first and second contact electrodes from each other; and a second insulating layer partially covering the first and second contact electrodes and including a first opening part and a second opening part through which the first contact electrode and the second contact electrode are exposed, wherein the first contact electrode is in ohmic-contact with the first conductivity type semiconductor layer through the exposed region, and the first and second electrodes are in direct contact with the first and second contact electrodes, respectively, through the first and second opening parts.

12. The light emitting device of claim 11, wherein the exposed region includes a plurality of holes.

13. The light emitting device of claim 11, wherein the light emitting structure includes at least one mesa including the second conductivity type semiconductor layer and the active layer, and the at least one mesa is not formed over the exposed region.

14. The light emitting device of claim 11, further comprising:

a wavelength conversion unit disposed on the second surface of the light emitting structure.

15. The light emitting device of claim 14, wherein the wavelength conversion unit contacts the first insulating layer.

16. The light emitting device of claim 14, wherein the wavelength conversion unit at least partially further covers a side of the first conductivity type semiconductor layer.

17. The light emitting device of claim 1, wherein the first electrode and the second electrode are in direct contact with the first and second contact electrodes, respectively.

18. A light emitting device, comprising:

a light emitting structure including a first conductivity type semiconductor layer, a second conductivity type semiconductor layer, and an active layer disposed between the first conductivity type semiconductor layer and the second conductivity type semiconductor layer and disposed between a first surface and a second surface opposite to the first surface;

first and second contact electrodes disposed on the first surface of the light emitting structure and ohmic-contacting the first and second conductivity type semiconductor layers;

a first electrode disposed on the first surface of the light emitting structure and electrically connected to the first contact electrode;

a second electrode disposed on the first surface of the light emitting structure and electrically connected to the second contact electrode; and an insulating part covering sides of the first and second electrodes and the first surface of the light emitting structure, wherein the first and second electrodes include metal particles ranging from 80 to 98 wt % and a nonmetallic material interposed between the metal particles.

19. A method of fabricating a light emitting device, comprising:

forming a light emitting structure including a first conductivity type semiconductor layer, an active layer disposed on the first conductivity type semiconductor layer, and a second conductivity type semiconductor layer disposed on the active layer on a growth substrate;

forming first and second contact electrodes to be in ohmic-contact with the first and second conductivity type semiconductor layers on the light emitting structure, respectively;

forming a pre-first electrode and a pre-second electrode to be electrically connected to the first and second contact electrodes, respectively, and include metal particles on the light emitting structure;

forming a first electrode and a second electrode, respectively, by sintering the pre-first electrode and the pre-second electrode; and forming insulating parts covering sides of the first and second electrodes on the light emitting structure, wherein each of the first and second electrodes includes an inclined side having tangential gradients with respect to a vertical line orthogonal to a surface of the first electrode or the second electrode, the tangential gradients changing along a surface of the inclined side.

20. The method of claim 19, wherein volumes of the first and second electrodes are smaller than those of the pre-first and the pre-second electrodes.

21. The method of claim 20, wherein the inclined side includes an area in which the tangential gradient is increased and an area in which the tangential gradient is reduced.

22. The method of claim 19, wherein the forming of the pre-first and the pre-second electrodes includes forming a viscous material including metal particles and a nonmetallic material interposed between the metal particles on the light emitting structure using a dispensing or applying method.

23. The method of claim 22, wherein the dispensing or applying method includes a dotting or screen printing method.

24. The method of claim 19, further comprising:
exposing surfaces of the first electrode and the second electrode by partially removing the first and second electrodes and the insulating part.

25. The method of claim 24, further comprising:
forming a first electrode pad and a second electrode pad contacting the exposed surfaces of the first electrode and the second electrode, respectively.

26. The method of claim 19, further comprising:
after the forming of the first and second electrodes, separating the growth substrate from the light emitting structure; and
forming a wavelength conversion unit on one surface of the light emitting structure exposed by separating the growth substrate therefrom.

27. The method of claim 19, wherein the pre-first electrode and the pre-second electrode contact the first contact electrode and the second contact electrode, respectively.

28. A light emitting device, comprising:
a light emitting structure including a first conductivity type semiconductor layer, a second conductivity type semiconductor layer, and an active layer disposed between the first conductivity type semiconductor layer and the second conductivity type semiconductor layer and disposed between a first surface and a second surface opposite to the first surface;
first and second contact electrodes disposed on the first surface of the light emitting structure to be in ohmic-contact with the first and second conductivity type semiconductor layers, respectively;
a first electrode and a second electrode disposed on a first surface of the light emitting structure and electrically connected to the first contact electrode and the second contact electrode, respectively; and
an insulating part covering sides of the first and second electrodes and the first surface of the light emitting structure and including a first portion disposed between the first electrode and the second electrode and a second portion disposed over an area around an edge of the light emitting structure, wherein the first and second electrodes include metal particles, and
a half value of a shortest distance of an interval between the first electrode and the second electrode is smaller than a distance between one of the first electrode and the second electrode and the second portion of the insulating part.

29. The light emitting device of claim 28, wherein the shortest distance between the first electrode and the second electrode ranges from 10 to 80 µm.

30. The light emitting device of claim 28, wherein each of the first and second electrodes includes an inclined side having tangential gradients with respect to a vertical line orthogonal to a surface of the first electrode or the second electrode, the tangential gradients changing along a surface of the inclined side.

31. The light emitting device of claim 30, wherein an angle formed by the sides of the first electrode and the second electrode and an upper surface of the light emitting structure ranges between 30° and 90°.

32. The light emitting device of claim 28, wherein the sides of the first electrode and the second electrode are perpendicular to the first side of the light emitting structure.

33. The light emitting device of claim 28, further comprising:
a first electrode pad and a second electrode pad disposed on the first and second electrodes, respectively, and extended to be located over one surface of the insulating part.

34. The light emitting device of claim 28, wherein each of the first and second electrodes includes the metal particles and a nonmetallic material interposed between the metal particles.

35. The light emitting device of claim 34, wherein each of the first and second electrodes includes the metal particles of 80 to 98 wt %.

36. The light emitting device of claim 28, wherein the metal particle includes at least one of Cu, Au, Ag, or Pt.

37. The light emitting device of claim 28, further comprising:
an exposed region in which the first conductivity type semiconductor layer is partially exposed and the active layer and the second conductivity type semiconductor layer are removed;
a first insulating layer insulating the first and second contact electrodes from each other; and
a second insulating layer partially covering the first and second contact electrodes and including a first opening part and a second opening part through which the first contact electrode and the second contact electrode are exposed,
wherein the first contact electrode is in ohmic-contact with the first conductivity type semiconductor layer through the exposed region, and
the first and second electrodes are in direct contact with the first and second contact electrodes, respectively, through the first and second opening parts.

38. The light emitting device of claim 28, wherein the first electrode and the second electrode are in direct contact with the first and second contact electrodes, respectively.

* * * * *